(12) United States Patent
Xu et al.

(10) Patent No.: US 11,985,902 B2
(45) Date of Patent: May 14, 2024

(54) DRIVING CIRCUIT AND DRIVING METHOD

(71) Applicant: SILERGY SEMICONDUCTOR TECHNOLOGY (HANGZHOU) LTD, Zhejiang (CN)

(72) Inventors: Zhiwei Xu, Zhejiang (CN); Chiqing Fang, Zhejiang (CN); Chen Zhao, Zhejiang (CN)

(73) Assignee: SILERGY SEMICONDUCTOR TECHNOLOGY HANGZHOU LTD, Zhejiang (CN)

( * ) Notice: Subject to any disclaimer, the term of this patent is extended or adjusted under 35 U.S.C. 154(b) by 415 days.

(21) Appl. No.: 17/326,063

(22) Filed: May 20, 2021

(65) Prior Publication Data
US 2021/0367133 A1 Nov. 25, 2021

(30) Foreign Application Priority Data

May 20, 2020 (CN) .......................... 202010431205.0

(51) Int. Cl.
*H10N 30/80* (2023.01)
*B06B 1/02* (2006.01)
*H10N 30/20* (2023.01)

(52) U.S. Cl.
CPC ......... *H10N 30/802* (2023.02); *B06B 1/0207* (2013.01); *H10N 30/20* (2023.02)

(58) Field of Classification Search
CPC .... H10N 30/802; H10N 30/20; B06B 1/0207; B06B 2201/55; B06B 1/0238;
(Continued)

(56) References Cited

U.S. PATENT DOCUMENTS 6,204,591 B1   3/2001 Nariai
6,703,762 B1*  3/2004 Okada .................... H02N 2/067
                                                    310/317
(Continued)

FOREIGN PATENT DOCUMENTS

CN       101027469 A     8/2007
CN       101606312 A    12/2009
(Continued)

*Primary Examiner* — David Luo
(74) *Attorney, Agent, or Firm* — CANTOR COLBURN LLP

(57) ABSTRACT

A driving circuit and a driving method are provided. The driving circuit includes a charging circuit and a discharging circuit. The charging circuit is configured to receive an input voltage to charge the piezoelectric load. The piezoelectric load discharges electricity through the discharging circuit. Operation states of the charging circuit and the discharging circuit are controlled. During a first operation interval of an operation period, the charging circuit charges the piezoelectric load so that a power supply voltage signal provided to the piezoelectric load corresponds to the reference voltage in a first interval. During a second operation interval of the operation period, the piezoelectric load discharges electricity through the discharging circuit so that the power supply voltage signal corresponds to the reference voltage in a second interval. The driving circuit according to the present disclosure requires a few switches, thereby facilitating circuit integration.

19 Claims, 26 Drawing Sheets

(58) Field of Classification Search
CPC ........ H02N 2/0075; H02M 3/04; H02M 3/10;
H02M 7/48
USPC .................................................. 318/116, 558
See application file for complete search history.

(56) References Cited

U.S. PATENT DOCUMENTS

| | | | |
|---|---|---|---|
| 7,193,351 B2 * | 3/2007 | Yoshida | .................. G02B 7/08 |
| | | | 310/317 |
| 7,271,522 B2 * | 9/2007 | Yuasa | .................... H02N 2/025 |
| | | | 310/317 |
| 7,667,371 B2 * | 2/2010 | Sadler | .................. G06F 1/3203 |
| | | | 310/317 |
| 2004/0207290 A1 | 10/2004 | Okada | |
| 2007/0242427 A1 | 10/2007 | Yamamoto et al. | |
| 2008/0042624 A1 | 2/2008 | Augesky et al. | |
| 2010/0026139 A1 | 2/2010 | Yoshida | |
| 2015/0060337 A1 | 3/2015 | Ito et al. | |
| 2016/0163953 A1 | 6/2016 | Park | |
| 2019/0353276 A1 | 11/2019 | Ito et al. | |

FOREIGN PATENT DOCUMENTS

| | | |
|---|---|---|
| CN | 102230457 A | 11/2011 |
| CN | 202867012 U | 4/2013 |
| CN | 104395658 A | 3/2015 |
| CN | 106411175 A | 2/2017 |
| CN | 110226283 A | 9/2019 |
| JP | H1189253 A | 3/1999 |
| JP | 2007250399 A | 9/2007 |
| JP | 2010142783 A | 7/2010 |
| JP | 2011055585 A | 3/2011 |
| JP | 2011183357 A | 9/2011 |
| JP | 2015127042 A | 7/2015 |

* cited by examiner

DRIVING CIRCUIT AND DRIVING METHOD

CROSS REFERENCE TO RELATED APPLICATIONS

The present invention claims priority under 35 U.S.C. § 119 to Chinese Patent Application No. 202010431205.0, filed on May 20, 2020, which the entire content of which is incorporated herein by reference.

FIELD

The present disclosure relates to the field of power electronics, and in particular to a driving circuit and a driving method for driving a piezoelectric load.

BACKGROUND

As a piezoelectric load or a piezoelectric actuator, a piezoelectric ceramic is increasingly widely used. In the conventional technology, a driving circuit for driving the piezoelectric ceramic is as shown in FIG. 1. The driving circuit according to the conventional technology includes a boost circuit 1 and a full-bridge inverter circuit 2. The boost circuit 1 converts an input voltage VDD. The full-bridge inverter circuit 2 converts direct current electricity outputted from the boost circuit 1 into alternating current electricity and outputs the alternating current, so as to drive a piezoelectric ceramic $C_{load}$.

The driving circuit according to the conventional technology requires a large number of switches when driving one piezoelectric ceramic, and requires more switches when driving multiple piezoelectric ceramics coupled to respective full-bridge inverter circuits 2, which is unconducive to circuit integration.

SUMMARY

In view of this, a driving circuit conducive to circuit integration and a driving method are provided according to the present disclosure, to solve the technical problem that the driving circuit according to the conventional technology is unconducive to circuit integration due to the large number of switches.

According to a first aspect, a driving circuit is provided according to an embodiment of the present disclosure. The driving circuit is configured to drive a piezoelectric load. The driving circuit includes a charging circuit, and a discharging circuit configured to discharge electricity from the piezoelectric load discharges electricity.

The charging circuit is configured to receive an input voltage to charge the piezoelectric load.

During a first operation interval of an operation period, operation states of the charging circuit and the discharging circuit are controlled, so that a power supply voltage signal provided to the piezoelectric load in the first operation interval corresponds to a reference voltage in a first interval. During a second operation interval of the operation period, the operation states of the charging circuit and the discharging circuit are controlled, so that the power supply voltage signal in the second operation interval corresponds to the reference voltage in a second interval.

In an embodiment, during the first operation interval, the discharging circuit is controlled to be cut off and the charging circuit is controlled to adjust the power supply voltage signal to change with the reference voltage in the first interval. During the second operation interval, the charging circuit is controlled to be cut off and the discharging circuit is controlled to adjust the power supply voltage signal to change with the reference voltage in the second interval.

In an embodiment, during the first operation interval, the discharging circuit is controlled to be cut off, and the charging circuit is controlled to operate in a PWM control mode to charge the piezoelectric load.

In an embodiment, during the second operation interval, the charging circuit is controlled to be cut off, and the discharging circuit is controlled to operate in a PWM control mode, so that the piezoelectric load discharges electricity through the discharging circuit.

In an embodiment, a waveform of the reference voltage is a sine wave with a trough value not less than zero.

In an embodiment, the reference voltage in the first interval corresponds to a rising part of the reference voltage within a period, and the reference voltage in the second interval corresponds to a falling part of the reference voltage within the period.

In an embodiment, the discharging circuit is connected to an output end of the charging circuit. Alternatively, the discharging circuit is connected in parallel with the piezoelectric load. Alternatively, the discharging circuit is connected in series with a first switch to form a branch, and the branch is connected to the output end of the charging circuit.

In an embodiment, the driving circuit further includes N voltage output circuits to drive N piezoelectric loads in one to one correspondence. The voltage output circuits are connected in parallel with each other. Each of the N voltage output circuits includes a selection switch. The selection switch is connected in series with a piezoelectric load driven by the voltage output circuit. The voltage output circuit is switched on or off by controlling the selection switch to be switched on or off. N is greater than or equal to 1.

In an embodiment, all the N voltage output circuits share the discharging circuit. The discharging circuit is connected in parallel with each of the voltage output circuits.

In an embodiment, the number of the discharging circuit is N, and the N voltage output circuits are coupled to the N discharging circuits in one to one correspondence. For each of the N voltage output circuits, the discharging circuit coupled to the voltage output circuit is connected in parallel with a piezoelectric load driven by the voltage output circuit.

In an embodiment, the N voltage output circuits each are connected to an output end of the charging circuit.

In an embodiment, the driving circuit further includes a first switch. Each of the N voltage output circuits is connected in series with the first switch to form a branch, and the branch is connected to the output end of the charging circuit.

In an embodiment, the number of the charging circuit is N and the number of the discharging circuit is N. The N discharging circuits are in one to one correspondence with the N charging circuits. For each of the piezoelectric loads, two ends of the piezoelectric load are respectively connected to high potential ends of two discharging circuits. Power supply voltage signals provided for the two ends of the piezoelectric load are controlled so that a voltage across the piezoelectric load is an alternating voltage. N is greater than or equal to 2.

In an embodiment, during one of two consecutive operation periods, a power supply voltage signal changing with the reference voltage is inputted to one end of the piezoelectric load; and during the other of the two consecutive operation periods, a power supply voltage signal changing with the reference voltage is inputted to the other end of the piezoelectric load.

In an embodiment, first ends of the (N−1) piezoelectric loads are connected to a same discharging circuit among the N discharging circuits, and second ends of the (N−1) piezoelectric loads are connected to other (N−1) discharging circuits among the N discharging circuits in one to one correspondence.

In an embodiment, the driving circuit further includes a control circuit. The control circuit is configured to generate a first control signal and a second control signal based on a compensation signal, to control operation states of the charging circuit and the discharging circuit, respectively. The compensation signal indicates a difference between the reference voltage and a sampling signal characterizing the power supply voltage signal.

In an embodiment, the control circuit includes a first PWM control circuit and a second PWM control circuit. The first PWM control circuit is configured to generate the first control signal. The second PWM control circuit is configured to generate the second control signal. During the first operation interval, the first PWM control circuit generates the first control signal of a PWM form based on the compensation signal, and the second PWM control circuit controls the second control signal to be invalid. During the second operation interval, the first PWM control circuit controls the first control signal to be invalid, and the second PWM control circuit generates the second control signal of a PWM form based on the compensation signal.

In an embodiment, the discharging circuit includes one of a charge pump, a discharging switch and a branch formed by multiple discharging switches that are connected in parallel, to control the piezoelectric load to discharge electricity through the discharging circuit.

In an embodiment, the charging circuit is a buck circuit, a boost circuit, a flyback circuit, a forward circuit, a boost-buck circuit or a buck-boost circuit.

According to a second aspect, a driving method is further provided according to an embodiment of the present disclosure. The driving method is applied to a driving circuit. The driving circuit includes a charging circuit for receiving an input voltage to charge a piezoelectric load, and a discharging circuit configured to discharge electricity from the piezoelectric load discharges electricity.

The driving method includes: during a first operation interval of an operation period, controlling operation states of the charging circuit and the discharging circuit, so that a power supply voltage signal provided to the piezoelectric load in the first operation interval corresponds to a reference voltage in a first interval; and during a second operation interval of the operation period, controlling the operation states of the charging circuit and the discharging circuit, so that the power supply voltage signal in the second operation interval corresponds to the reference voltage in a second interval.

In an embodiment, during the first operation interval, the discharging circuit is controlled to be cut off and the charging circuit is controlled to adjust the power supply voltage signal to change with the reference voltage in the first interval. During the second operation interval, the charging circuit is controlled to be cut off and the discharging circuit is controlled to adjust the power supply voltage signal to change with the reference voltage in the second interval.

In an embodiment, during the first operation interval, the discharging circuit is controlled to be cut off, and the charging circuit is controlled to operate in a PWM control mode to charge the piezoelectric load.

In an embodiment, during the second operation interval, the charging circuit is controlled to be cut off, and the discharging circuit is controlled to operate in a PWM control mode, so that the piezoelectric load discharges electricity through the discharging circuit.

In an embodiment, two ends of the piezoelectric load are coupled to two discharging circuits in one to one correspondence, and power supply voltage signals respectively provided to the two ends of the piezoelectric load are controlled, so that a voltage across the piezoelectric load is an alternating current voltage.

In an embodiment, during one of two consecutive operation periods, the power supply voltage signal inputted to one end of the piezoelectric load changes with the reference voltage in one of two consecutive periods. During the other of the two consecutive operation periods, the power supply voltage signal inputted to the other end of the piezoelectric load changes with the reference voltage in the other of the two consecutive periods.

Compared with the conventional technology, the technical solutions according to the present disclosure have the following advantages. The driving circuit according to the present disclosure includes a charging circuit and a discharging circuit. The charging circuit is configured to receive an input voltage to charge the piezoelectric load. The piezoelectric load discharges electricity through the discharging circuit. The operation states of the charging circuit and the discharging circuit are controlled. During a first operation interval of an operation period, the charging circuit charges the piezoelectric load so that a power supply voltage signal provided to the piezoelectric load corresponds to the reference voltage in a first interval. During a second operation interval of the operation period, the piezoelectric load discharges electricity through the discharging circuit so that the power supply voltage signal corresponds to the reference voltage in a second interval. The reference voltage in first the interval corresponds to a rising part of the reference voltage within a period, and the reference voltage in the second interval corresponds to a falling part of the reference voltage within the period. In an embodiment, the waveform of the reference voltage is a sine wave with a trough value not less than zero. In the present disclosure, the operation states of each of the charging circuits and the discharging circuits are controlled based on the reference voltage, so that the power supply voltage signal changes with the reference voltage. The driving circuit according to the present disclosure requires a few switches, thereby facilitating circuit integration.

BRIEF DESCRIPTION OF THE DRAWINGS

The above and other objects, features and advantages of the present disclosure will become clearer by describing the embodiments of the present disclosure below with reference to the drawings. In the drawings.

DETAILED DESCRIPTION OF EMBODIMENTS

Figure 1:
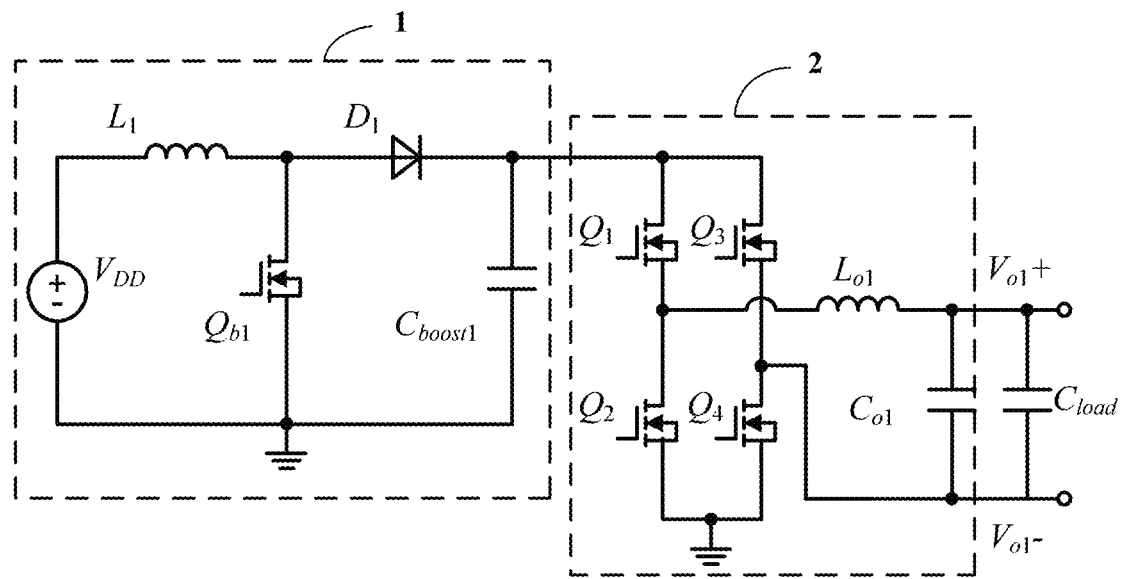
FIG. 1 is a schematic diagram of a driving circuit according to the conventional technology.

The present disclosure is described below based on embodiments. However, the present disclosure is not limited to the embodiments. In the description of details of the present disclosure hereinafter, some specific details are described. Those skilled in the art can completely understand the present disclosure without the description of the details. In order to avoid obscuring the substance of the present disclosure, well-known methods, procedures, processes, elements and circuits are not described in detail.

In addition, those skilled in the art should understand that the drawings are provided herein for illustration, and are unnecessarily drawn to scale.

In addition, it should be understood that in the following description, the term "circuit" indicates a conductive loop formed by at least one element or sub-circuit through electrical connection or electromagnetic connection. When an element or circuit is "connected to" another element or when an element or circuit is "connected" between two nodes, the element or circuit may be directly coupled or connected to another element, or there is other element between the element or circuit and another element. The connection between elements may be physical, logical, or a combination thereof. In addition, when an element is "directly coupled" or "directly connected" to another element, there is no element between the element and another element.

A driving circuit is provided according to an embodiment of the present disclosure. The driving circuit is configured to drive a piezoelectric load. The driving circuit includes a charging circuit and a discharging circuit.

The charging circuit is configured to receive an input voltage to charge the piezoelectric load.

The piezoelectric load discharges electricity through the discharging circuit.

During a first operation interval of an operation period, operation states of the charging circuit and the discharging circuit are controlled, so that a power supply voltage signal provided to the piezoelectric load in the first operation interval corresponds to a reference voltage in a first interval. During a second operation interval of the operation period, operation states of the charging circuit and the discharging circuit are controlled, so that the power supply voltage signal in the second operation interval corresponds to the reference voltage in a second interval.

In an embodiment, the charging circuit is a buck circuit, a boost circuit, a flyback circuit, a forward circuit, a boost-buck circuit, a buck-boost circuit or a circuit of other topology type, which is not limited in the present disclosure.

Furthermore, during the first operation interval, the discharging circuit is controlled to be cut off and the charging circuit is controlled to operate so that the power supply voltage signal corresponds to the reference voltage in the first interval. During the second operation interval, the charging circuit is controlled to be cut off and the discharging circuit is controlled to operate so that the power supply voltage signal corresponds to the reference voltage in the second interval.

Specifically, during the first operation interval, the discharging circuit is controlled to be cut off, and the charging circuit is controlled to operate in a PWM control mode so as to charge the piezoelectric load. During the second operation interval, the charging circuit is controlled to be cut off, and the discharging circuit is controlled to operate in a PWM control mode so that the piezoelectric load discharges electricity through the discharging circuit.

Furthermore, the reference voltage in the first interval corresponds to a rising part of the reference voltage within a period. The reference voltage in the second interval corresponds to a falling part of the reference voltage within the period. In an embodiment, a waveform of the reference voltage is a sine wave with a trough value not less than zero.

In an embodiment, the discharging circuit is connected to an output end of the charging circuit. Alternatively, the discharging circuit is connected in parallel with the piezoelectric load. Alternatively, the discharging circuit is connected in series with a first switch to form a branch, and the branch is connected to the output end of the charging circuit.

Furthermore, the driving circuit further includes N voltage output circuits to drive N piezoelectric loads in one to one correspondence. The N voltage output circuits are connected in parallel with each other. Each of the N voltage output circuits includes a selection switch, which is connected in series with a piezoelectric load driven by the voltage output circuit. The voltage output circuit is switched on or off by controlling the selection switch to be switched on or off. N is greater than or equal to 1.

In an embodiment, all the N voltage output circuits share the discharging circuit. The discharging circuit is connected in parallel with each of the voltage output circuits. In an embodiment, the voltage output circuits are connected to an output end of the charging circuit. In an embodiment, the driving circuit further includes a first switch. Each of the N voltage output circuits is connected in series with the first switch to form a branch, and the branch is connected to the output end of the charging circuit.

In an embodiment, the number of the discharging circuit is N, the N voltage output circuits are coupled to N discharging circuits in one to one correspondence. For each of the N voltage output circuits, the discharging circuit coupled to the voltage output circuit is connected in parallel with a piezoelectric load driven by the voltage output circuit.

Furthermore, the number of the charging circuit is N, the number of the discharging circuit is N, and the N charging circuits are in one-to-one correspondence with the N discharging circuits, to provide power supply voltage signals for (N−1) piezoelectric loads.

For each of the (N−1) piezoelectric loads, two ends of the piezoelectric load are respectively connected to high potential ends of two discharging circuits. Power supply voltage signals provided for the two ends of the piezoelectric load are controlled so that a voltage across the piezoelectric load is an alternating current voltage. N is greater than or equal to 2.

Furthermore, during one of two consecutive operation periods, a power supply voltage signal inputted to one end of the piezoelectric load changes with the reference voltage in one of two consecutive periods. During the other of the two consecutive operation periods, a power supply voltage signal inputted to the other end of the piezoelectric load changes with the reference voltage in the other of the two consecutive periods.

In an embodiment, first ends of the (N−1) piezoelectric loads are connected to a same discharging circuit among the N discharging circuits, and second ends of the (N−1) piezoelectric loads are respectively connected to other (N−1) discharging circuits among the N discharging circuits, which is convenient to control the driving circuit.

Furthermore, the discharging circuit includes a charge pump, a discharging switch or a branch formed by multiple discharging switches connected in parallel with each other, so that the piezoelectric load discharges electricity through the discharging circuit. In a case that multiple piezoelectric loads are driven by a driving circuit, the discharging circuit is required to bear a large discharged current. The discharging circuit including multiple discharging switches connected in parallel with each other has relatively low requirements for the switches, exhibiting apparent advantages. In the following embodiments of the present disclosure, the discharging circuit includes one discharging switch. However, the present disclosure is not limited to this case.

The driving circuit according to the present disclosure is divided into two categories. In a first category, only one end of a piezoelectric load is coupled to a charging circuit, so that a voltage across the piezoelectric load is a direct current voltage. In a second category, two ends of a piezoelectric load are coupled to respective charging circuits, so that a voltage across the piezoelectric load is an alternating current voltage. The piezoelectric load according to the present disclosure includes a piezoelectric device such as a piezoelectric ceramic or a piezoelectric actuator. Switches and selection switches in the present disclosure are not only implemented by MOS transistors but also implemented by BJTs or IGBTs, which is not limited in the present disclosure. A control principle of the driving circuit according to the present disclosure is described below. The operation states of the charging circuit and the discharging circuit are controlled based on the reference voltage to adjust the power supply voltage signal to change with the reference voltage. The operation states of the charging circuit and the discharging circuit are controlled, so that during a first operation interval of an operation period, the charging circuit charges the piezoelectric load and a power supply voltage signal during the first operation interval corresponds to the reference voltage in a first interval, and during a second operation interval of the operation period, the piezoelectric load discharges electricity through the discharging circuit and the power supply voltage signal during the second operation interval corresponds to the reference voltage in a second interval. The reference voltage in the first interval according to the present disclosure refers to a rising part of the reference voltage within a period. The reference voltage in the second interval refers to a falling part of the reference voltage within the period. In an embodiment, a waveform of the reference voltage is a sine wave with a trough value not less than zero. The following embodiments of the present disclosure are described by taking a case in which the waveform of the reference voltage is a sine wave with a trough value not less than zero as an example. However, the reference voltage may be in other forms. For example, the waveform of the reference voltage is a rectified sine wave, which is not limited in the present disclosure. The driving circuit according to the present disclosure includes a few switches, a simple structure and therefore is easy to be implemented, thereby facilitating circuit integration. In addition, it is easy to add voltage output circuits for driving piezoelectric loads, and voltage output circuits do not interfere with each other. The driving circuit according to the present disclosure can output varying direct current voltage or alternating current voltage, and an outputted waveform of the driving circuit is programmable. In some embodiments, all switches in the driving circuit according to the present disclosure are common ground switches, which require simpler detection and control technologies than floating ground switches, thereby facilitating circuit integration.

Compared with the conventional technology, the driving circuit according to the present disclosure has simple structure and includes fewer devices, so that a volume of the driving circuit is reduced, cost of the driving circuit is reduced, and power density of the driving circuit is improved. In addition, the output end of the charging circuit in the driving circuit according to the present disclosure is coupled to no output capacitor and directly charges the piezoelectric load, thereby reducing energy loss.

Figure 2:
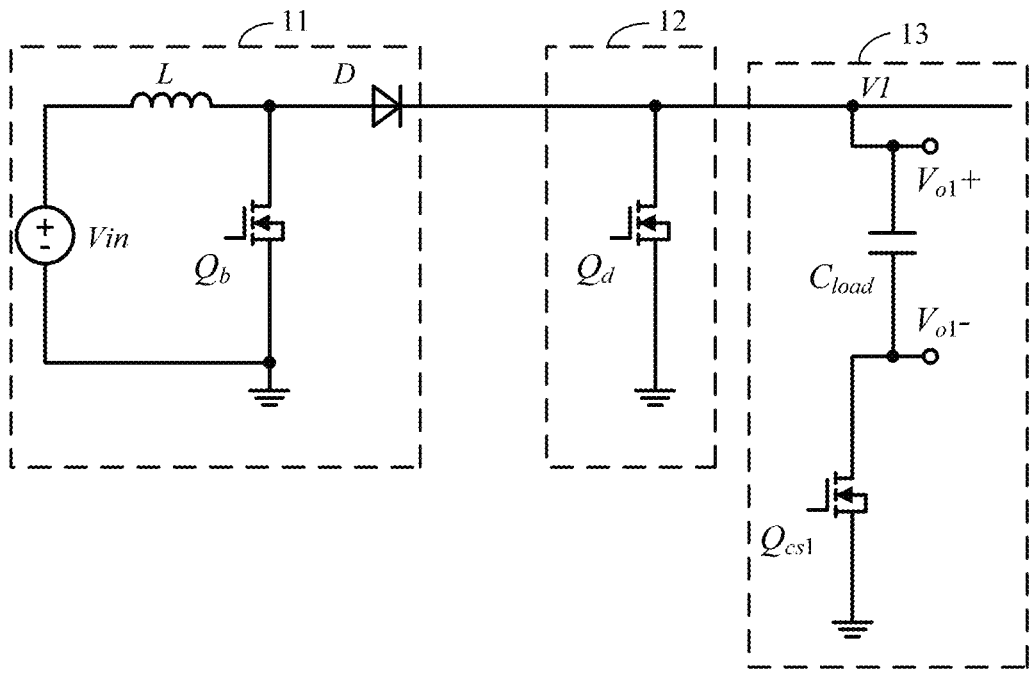
FIG. 2 is a schematic diagram of a driving circuit according to a first embodiment of the present disclosure.

FIG. 2 is a schematic diagram of a driving circuit according to a first embodiment of the present disclosure. The driving circuit includes a charging circuit 11 and a discharging circuit 12. The charging circuit and the discharging circuit are all coupled to a piezoelectric load or a piezoelectric actuator $C_{load}$, so as to drive the piezoelectric load or the piezoelectric actuator $C_{load}$. The charging circuit 11 is configured to charge the piezoelectric load $C_{load}$ during a first operation interval of an operation period, so that a power supply voltage signal V1 supplied to the piezoelectric load $C_{load}$ in the first operation interval corresponds to a reference voltage in a first interval. During a second operation interval of the operation period, the piezoelectric load $C_{load}$ discharges electricity through the discharging circuit 12 so that the power supply voltage signal V1 in the second operation interval corresponds to the reference voltage in a second interval.

In the embodiment, a waveform of the reference voltage is a sine wave with a trough value not less than zero. The reference voltage in the first interval refers to a rising part of the reference voltage within a period. The reference voltage in the second interval refers to a falling part of the reference voltage within the period.

In the embodiment, the charging circuit 11 receives an input voltage Vin. The discharging circuit 12 is connected to an output end of the charging circuit 11. The driving circuit provides the power supply voltage signal V1 to the piezoelectric load $C_{load}$. The driving circuit further includes a control circuit (not shown in the FIG. 2). The control circuit is configured to control, during a first operation interval of an operation period, operation states of the charging circuit 11 and the discharging circuit 12, so that the charging circuit 11 charges the piezoelectric load $C_{load}$, the power supply voltage signal V1 in the first operation interval corresponds to the reference voltage in the first interval. The control circuit is further configured to control, during a second operation interval of the operation period, operation states of the discharging circuit 12 and the charging circuit 11, so that the piezoelectric load $C_{load}$ discharges electricity through the discharging circuit 12, the power supply voltage signal V1 in the second operation interval corresponds to the reference voltage in the second interval.

In the embodiment, the charging circuit 11 is a boost circuit. The boost circuit includes a main switch $Q_b$, an inductor L and a rectifier D. The inductor L is connected in series with the main switch $Q_b$ to form a branch, and the branch is connected at the output end of an input power supply. A common end of the main switch $Q_b$ and the input power supply is grounded. A positive terminal of the rectifier D is connected to a common end of the inductor L and the main switch $Q_b$. A negative terminal of the rectifier D serves as a high potential end of the output ends of the charging circuit 11. Since a voltage of a low potential end of the output ends of the charging circuit 11 is equal to zero, a voltage of the high potential end of the output ends of the charging circuit 11 is equal to an output voltage of the charging circuit 11. The discharging circuit 12 is connected at the output ends of the charging circuit 11. In other embodiments, the rectifier D is a switch. In this embodiment, the discharging circuit 12 includes a discharging switch $Q_d$. A first terminal of the discharging switch $Q_d$ is connected to the high potential end of the output ends of the charging circuit 11, and a second terminal of the discharging switch $Q_d$ is grounded. The output end of the charging circuit is coupled to no output capacitor, and the charging circuit directly charges the piezoelectric load, thereby reducing energy loss. In other embodiments, the charging circuit may be a buck circuit, a boost circuit, a flyback circuit, a forward circuit, a boost-buck circuit, a buck-boost circuit or a circuit of other topology type, which is not limited in the present disclosure.

In the embodiment, during the first operation interval, the discharging circuit 12 is controlled to be cut off and the charging circuit 11 is controlled to operate in a PWM control mode so as to charge the piezoelectric load $C_{load}$. During the second operation interval, the charging circuit 11 is controlled to be switched off and the discharging circuit 12 is controlled to operate in the PWM control mode, so that the piezoelectric load $C_{load}$ discharges electricity through the discharging circuit 12. The control circuit controls the switching states of the main switch $Q_b$, the discharging switch $Q_d$ and the selection switch $Q_{cs1}$, so that the power supply voltage signal V1 is adjusted to change with the reference voltage. Specifically, the power supply voltage signal V1 during the first operation interval of the operation period corresponds to the reference voltage in the first interval; the power supply voltage signal V1 during the second operation interval of the operation period corresponds to the reference voltage in the second interval.

The driving circuit further includes a voltage output circuit 13. The voltage output circuit 13 includes a selection switch $Q_{cs1}$. The piezoelectric load $C_{load}$ is connected in series with the selection switch $Q_{cs1}$ to form a branch, and the branch is connected in parallel with the discharging circuit 12. The voltage output circuit 13 is switched on or off by controlling the selection switch $Q_{cs1}$ to be switched on or off, to drive or not drive the piezoelectric load $C_{load}$. In an embodiment, in a case that the piezoelectric load $C_{load}$ is required to be driven, the selection switch $Q_{cs1}$ is controlled to be switched on and the driving circuit starts to operate, which is not limited in the present disclosure. In other embodiments, the driving circuit includes no voltage output circuit 13, and the discharging circuit is connected in parallel with the piezoelectric load $C_{load}$. In the embodiment, a terminal of the selection switch $Q_{cs1}$ in the branch is grounded, and the selection switch is a common ground switch. In other embodiments, an end of the piezoelectric load $C_{load}$ in the branch is grounded, and the selection switch is a floating ground switch. In an embodiment, the selection switch $Q_{cs1}$ is a switch.

In the embodiment, the main switch $Q_b$ in the charging circuit 11, the discharging switch $Q_d$ and the selection switch $Q_{cs1}$ are all common ground switches. That is, switches in the driving circuit are all common ground switches, which require simpler detection and control technologies than floating ground switches, thereby facilitating circuit integration.

Figure 3:
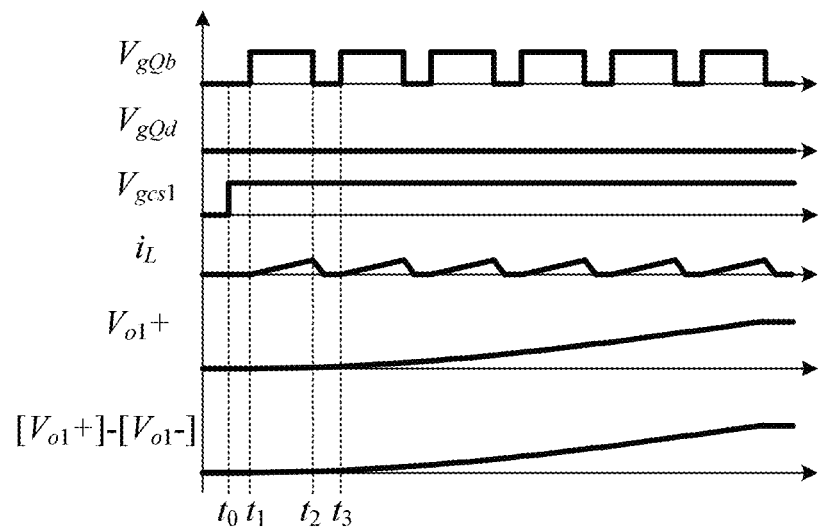
FIG. 3 is a schematic diagram showing operation waveforms of the driving circuit according to the first embodiment of the present disclosure in a start-up phase.
Figure 4:
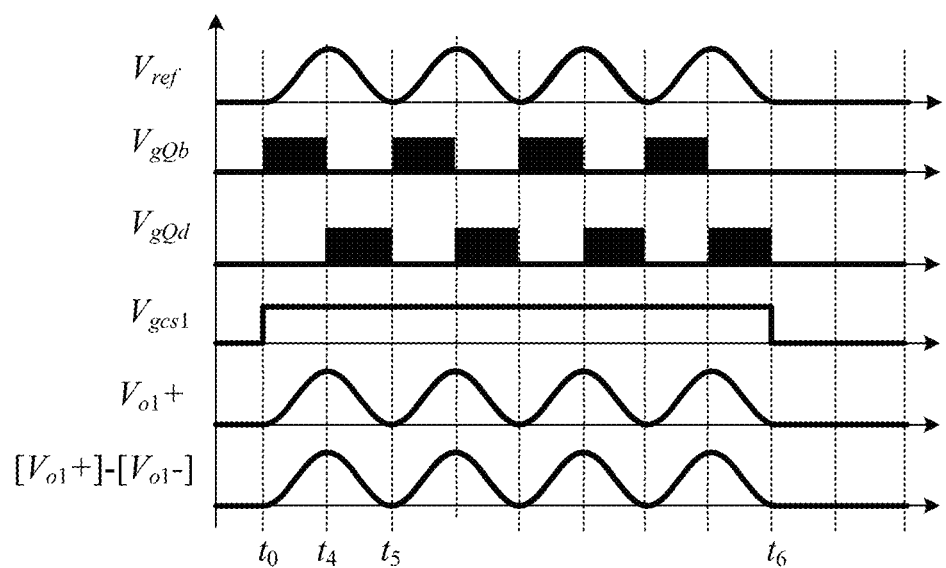
FIG. 4 is a schematic diagram showing operation waveforms of the driving circuit according to the first embodiment of the present disclosure.

An operation process of the driving circuit according to the first embodiment is described below in conjunction with FIG. 3, FIG. 4, FIG. 5A, FIG. 5B and FIG. 5C. $V_{gQb}$ represents a driving signal for the switch $Q_b$, $V_{gQd}$ represents a driving signal for the discharging switch $Q_d$, $V_{gcs1}$ represents a driving signal for the selection switch $Q_{cs1}$, $i_L$ represents a current passing through the inductor L, $V_{o1}+$ represents a voltage of a high potential end of the piezoelectric load, $[V_{o1}+]-[V_{o1}-]$ represents a voltage difference between two ends of the piezoelectric load, and $V_{ref}$ represents the reference voltage. A waveform of the reference voltage is a sine wave with a trough value not less than zero. FIG. 3 is a schematic diagram showing operation waveforms of the driving circuit according to the first embodiment during a start-up phase. FIG. 4 is a schematic diagram showing operation waveforms of the driving circuit according to the first embodiment after the driving circuit operates stably. FIG. 3 shows operation waveforms during an operation interval from a time instant $t_0$ to a time instant $t_4$ in FIG. 4. A time instant $t_0$ in FIG. 3 and the time instant $t_0$ in FIG. 4 refer to the same time instant. The time instant $t_4$ is later than a time instant $t_3$. In the embodiment, a voltage $V_{o1}-$ of a low potential end of the piezoelectric load is equal to 0 when the selection switch $Q_{cs1}$ is switched on, such that a waveform of $[V_{o1}+]-[V_{o1}-]$ is the same as that of $V_{o1}+$, and the power supply voltage signal V1 is configured as the voltage $V_{o1}+$ of the high potential end of the piezoelectric load.

At the time instant $t_0$, $V_{gcs1}$ is at a high level and the selection switch $Q_{cs1}$ is switched on.

Figure 5A:
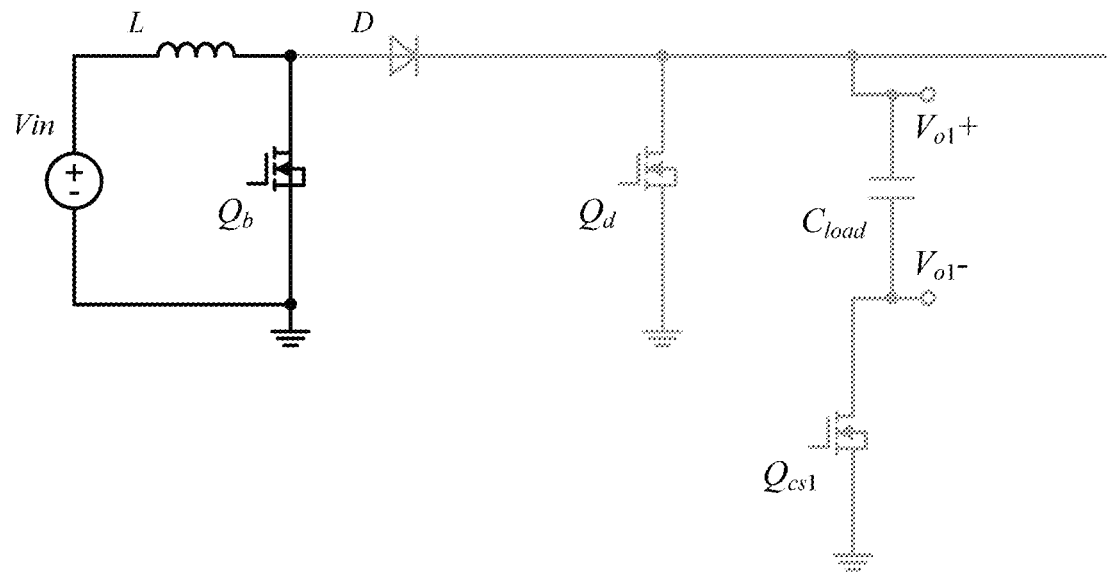
FIG. 5A to FIG. 5C are schematic diagrams showing operation states of the driving circuit according to the first embodiment of the present disclosure during operation intervals respectively.

During an operation interval from a time instant $t_1$ to a time instant $t_2$, $V_{gQb}$ is at a high level. The main switch $Q_b$ in the charging circuit 11 is switched on. The driving circuit operates as shown in FIG. 5A. The current $i_L$ passing through the inductor L increases and the inductor L stores energy.

Figure 5B:
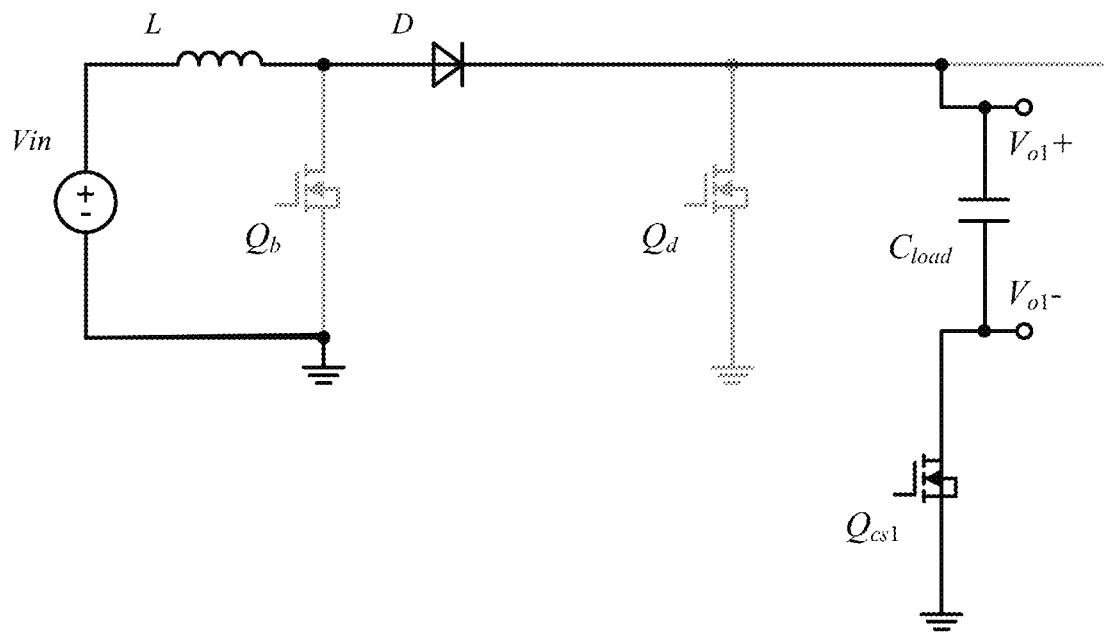

During an operation interval from the time instant $t_2$ to the time instant $t_3$, $V_{gQb}$ is at a low level. The main switch $Q_b$ in the charging circuit 11 is switched off. The driving circuit operates as shown in FIG. 5B. The current $i_L$ passing through the inductor L decreases and the inductor L discharges electricity to the piezoelectric load $C_{load}$. The voltage $V_{o1}+$ of the high potential end of the piezoelectric load increases. The process from the time instant $t_1$ to the time instant $t_3$ is repeated, so that the power supply voltage signal $V_1$ increases with the reference voltage $V_{ref}$ until the time instant $t_4$. The power supply voltage signal $V_1$ reaches a maximum value of the reference voltage $V_{ref}$ at the time instant $t_4$.

As shown in FIG. 4, during an operation interval from the time instant $t_0$ to the time instant $t_4$, the discharging switch $Q_d$ is switched off and the main switch $Q_b$ of the charging circuit 11 operates in a PWM mode. During this operation interval, the charging circuit 11 charges the piezoelectric load $C_{load}$ so that the power supply voltage signal V1 increases with the reference voltage $V_{ref}$ in this operation interval. The voltage $V_{o1}+$ of the high potential end of the piezoelectric load during this operation interval is as shown in FIG. 4.

Figure 5C:
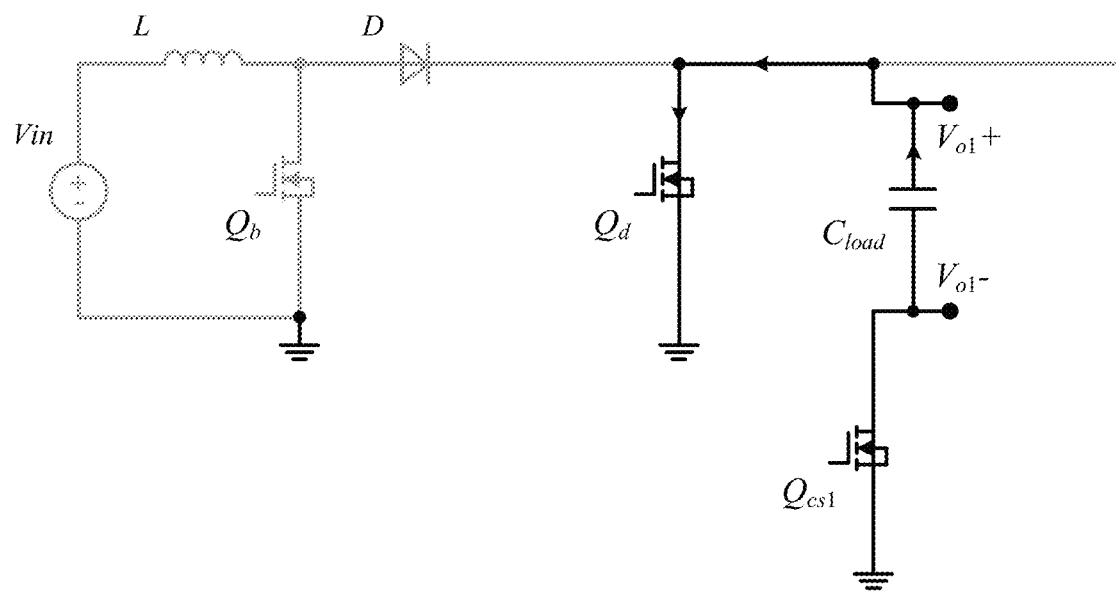

During an operation interval from the time instant $t_4$ to a time instant $t_5$, the main switch $Q_b$ in the charging circuit 11 is switched off and the discharging switch $Q_d$ in the discharging circuit 12 is controlled to operate in a PWM mode. During this operation interval, the piezoelectric load $C_{load}$ discharges electricity through the discharging circuit 12, and the supply voltage signal V1 decreases with the reference voltage $V_{ref}$ in this operation interval, so that the voltage $V_{o1}+$ of the high potential end of the piezoelectric load during this operation interval is as shown in FIG. 4. When the main switch $Q_b$ in the charging circuit 11 is switched off and the discharging switch $Q_d$ is switched on, the driving circuit operates as shown in FIG. 5C, and the piezoelectric load $C_{load}$ discharges electricity via the discharging switch $Q_d$.

An operation interval from the time instant $t_0$ to the time instant $t_5$ is one operation period. The operation process during the operation interval from the time instant $t_0$ to the time instant $t_5$ is repeated, so that the power supply voltage signal V1 changes with the reference voltage $V_{ref}$ until a time instant $t_6$. At the time instant $t_6$, the selection switch $Q_{cs1}$ is switched off, so that the piezoelectric load $C_{load}$ is disconnected from the driving circuit, and the voltage $V_{o1}+$ of the high potential end of the piezoelectric load $C_{load}$ is equal to 0.

Figure 6:
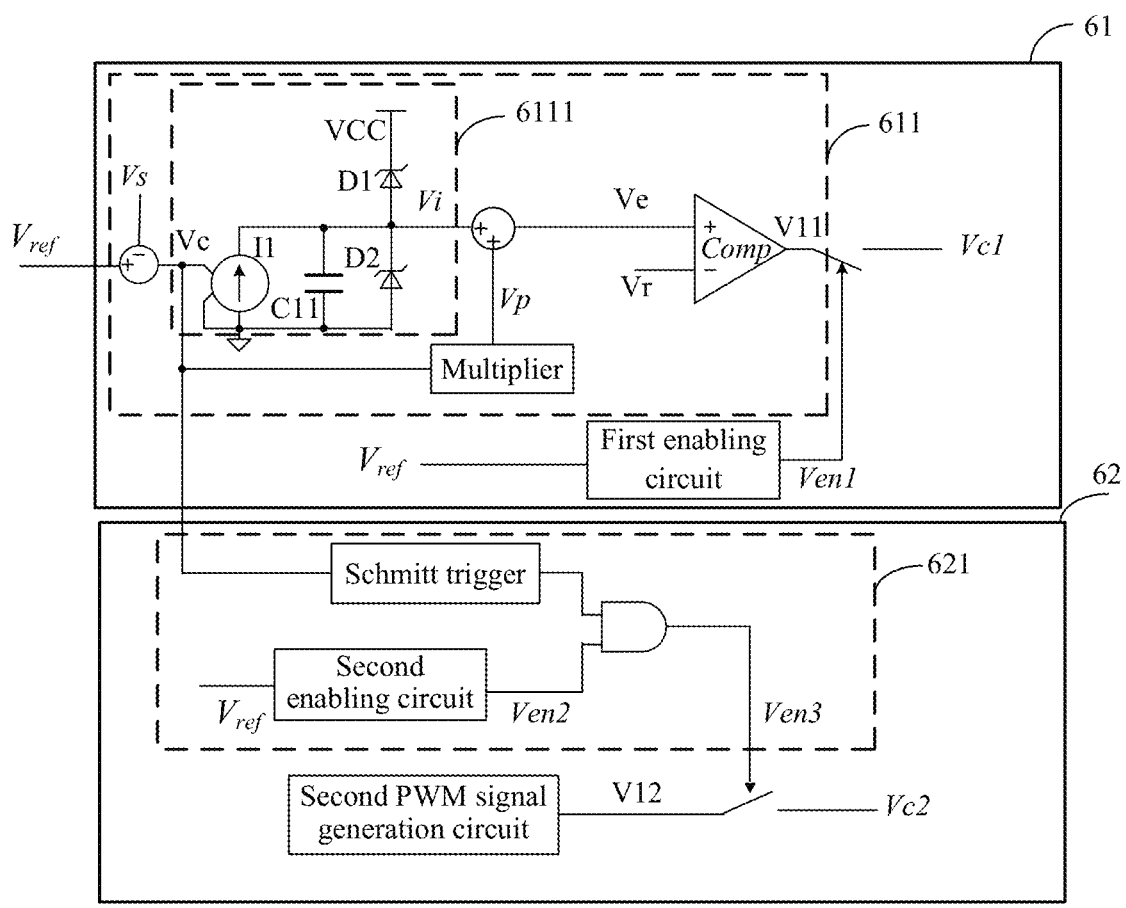
FIG. 6 is a schematic diagram of a control circuit of the driving circuit according to the first embodiment of the present disclosure.

FIG. 6 is a schematic diagram of a control circuit of the driving circuit according to a first embodiment of the present disclosure. The control circuit includes a first PWM control circuit 61 and a second PWM control circuit 62. The first PWM control circuit 61 is configured to generate a first control signal Vc1 to control the main switch $Q_b$ in the charging circuit 11 to be switch on or switched off. The second PWM control circuit 62 is configured to generate a second control signal Vc2 to control the discharging switch $Q_d$ in the discharging circuit 12 to be switch on or switched off.

The first PWM control circuit 61 includes a first PWM signal generation circuit 611 and a first enabling circuit. The first enabling circuit generates a first enabling signal Ven1 based on the reference voltage $V_{ref}$. When the first enabling signal Ven1 is valid, the first PWM signal generation circuit 611 is enabled to generate a first PWM signal V11 which serves as the first control signal Vc1 to control the main switch $Q_b$ to operate in the PWM mode. When the first enabling signal Ven1 is invalid, the first PWM signal V11 serving as the first control signal Vc1 is invalid, so that the main switch $Q_b$ is switched off. In an embodiment, during the reference voltage $V_{ref}$ increases from a minimum value to a maximum value, the first enabling signal Ven1 is valid.

The second PWM control circuit 62 includes a second PWM signal generation circuit and an enabling module 621. The enabling module 621 outputs a third enabling signal Ven3. When the third enabling signal Ven3 is valid, the second PWM signal generation circuit is enabled to generate a second PWM signal V12 which serves as the second control signal Vc2 to control the discharging switch $Q_d$ to operate in the PWM mode. When the third enabling signal Ven3 is invalid, the second PWM signal V12 serving as the second control signal Vc2 is invalid, so that the discharging switch $Q_d$ is switched off. In an embodiment, the second PWM signal V12 generated by the second PWM signal generation circuit has a fixed frequency and/or duty cycle.

The first PWM signal generation circuit 611 includes an integration circuit 6111, a multiplier and a comparator Comp. The integration circuit 6111 and the multiplier both receive a compensation signal $V_c$. An output signal Vi of the integration circuit 6111 and an output signal Vp of the multiplier are superimposed to obtain a signal Ve and the signal $V_c$ is inputted to an non-inverting input terminal of the comparator Comp. An inverting input terminal of the comparator Comp receives a ramp signal Vr. An output signal V11 of the comparator Comp serves as an output signal of the first PWM signal generation circuit 611. The compensation signal $V_c$ indicates a difference between the reference voltage $V_{ref}$ and a sampling signal Vs characterizing the voltage $V_{o1}+$ of a high potential end of the piezoelectric load.

The integration circuit 6111 includes a voltage-controlled current source I1 and a capacitor C11. The voltage-controlled current source I1 receives the compensation signal Vc, and outputs a current to charge the capacitor C11. A voltage across the capacitor C11 serves as an output signal Vi of the integration circuit 6111. The integration circuit 6111 further includes Zener diodes D1 and D2. The Zener diode D2 and the capacitor C11 are connected in parallel. The Zener diodes D1 and D2 are connected in series between a power supply Vcc and the ground, to limit a maximum value of a current outputted from the voltage-controlled current source I1, functioning as a clamp circuit.

The enabling module 621 includes a Schmitt trigger and a second enabling circuit. The second enabling circuit generates a second enabling signal Ven2 based on the reference voltage $V_{ref}$. The Schmitt trigger receives the compensation signal $V_c$. An output signal of the Schmitt trigger and the second enabling signal Ven2 pass through an AND gate to generate a third enabling signal Ven3. In an embodiment, during the reference voltage $V_{ref}$ decreases from the maximum value to the minimum value, the second enable signal Ven2 is valid.

The control circuit according to the first embodiment of the present disclosure may have other form or structure in other embodiments, which are not limited in the present disclosure.

Figure 7:
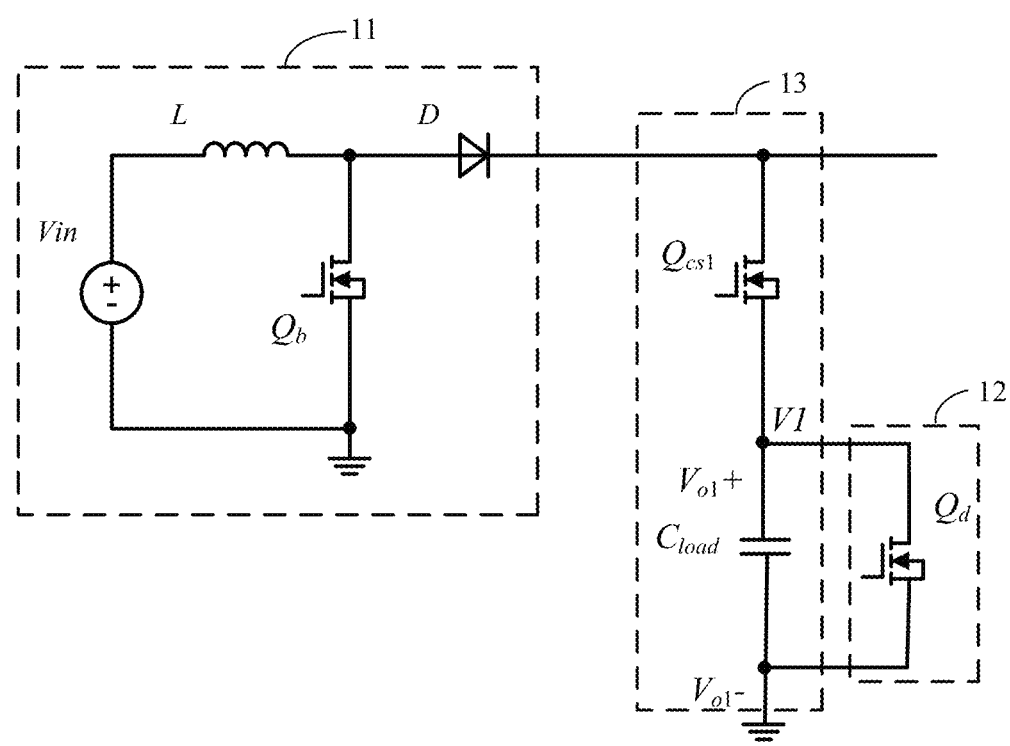
FIG. 7 is a schematic diagram of a driving circuit according to a second embodiment of the present disclosure.

FIG. 7 is a schematic diagram of a driving circuit according to a second embodiment of the present disclosure. The driving circuit according to the second embodiment is different from the driving circuit according to the first embodiment in that: the discharging switch $Q_d$ in the discharging circuit 12 is connected in parallel with the piezoelectric load $C_{load}$, and the selection switch $Q_{cs1}$ and the piezoelectric load $C_{load}$ are sequentially connected in series between the high potential end of the output ends of the charging circuit 11 and the ground.

Figure 8:
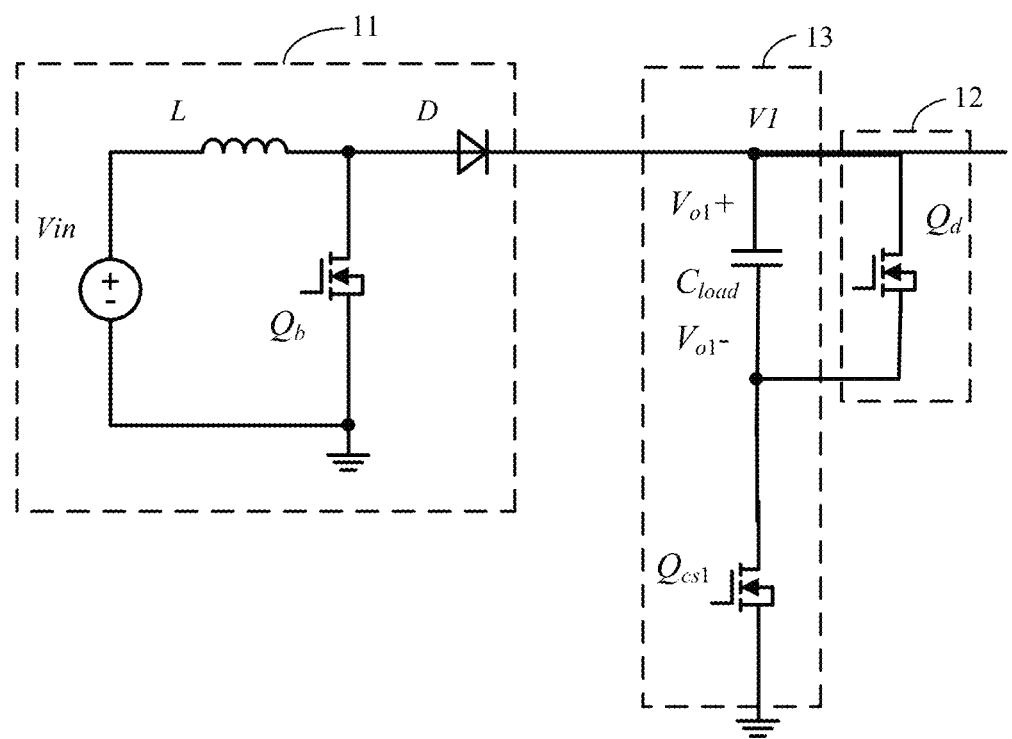
FIG. 8 is a schematic diagram of a driving circuit according to a third embodiment of the present disclosure.

FIG. 8 is a schematic diagram of a driving circuit according to a third embodiment of the present disclosure. The driving circuit according to the third embodiment is different from the driving circuit according to the first embodiment in that: the discharging switch $Q_d$ in the discharging circuit 12 connected in parallel with the piezoelectric load $C_{load}$.

In the second embodiment and the third embodiment of the present disclosure, during the second operation interval of the operation period, the piezoelectric load $C_{load}$ discharges electricity through the discharging circuit 12, so that the power supply voltage signal corresponds to the reference voltage in the second interval. When the charging circuit 11 charges the piezoelectric load $C_{load}$, the selection switch $Q_{cs1}$ is switched on. When the piezoelectric load $C_{load}$ discharges electricity through the discharging circuit 12, the selection switch $Q_{cs1}$ is switched off. In an embodiment, when the piezoelectric load $C_{load}$ is required to be driven, the voltage output circuit 13 is enabled and the selection switch $Q_{cs1}$ operates. That is, when the piezoelectric load $C_{load}$ is required to be driven and the charging circuit 11 charges the piezoelectric load $C_{load}$, the selection switch $Q_{cs1}$ is switched on. Other details in the second embodiment and the third embodiment are the same as that in the first embodiment and thus are not repeated herein.

Figure 9:
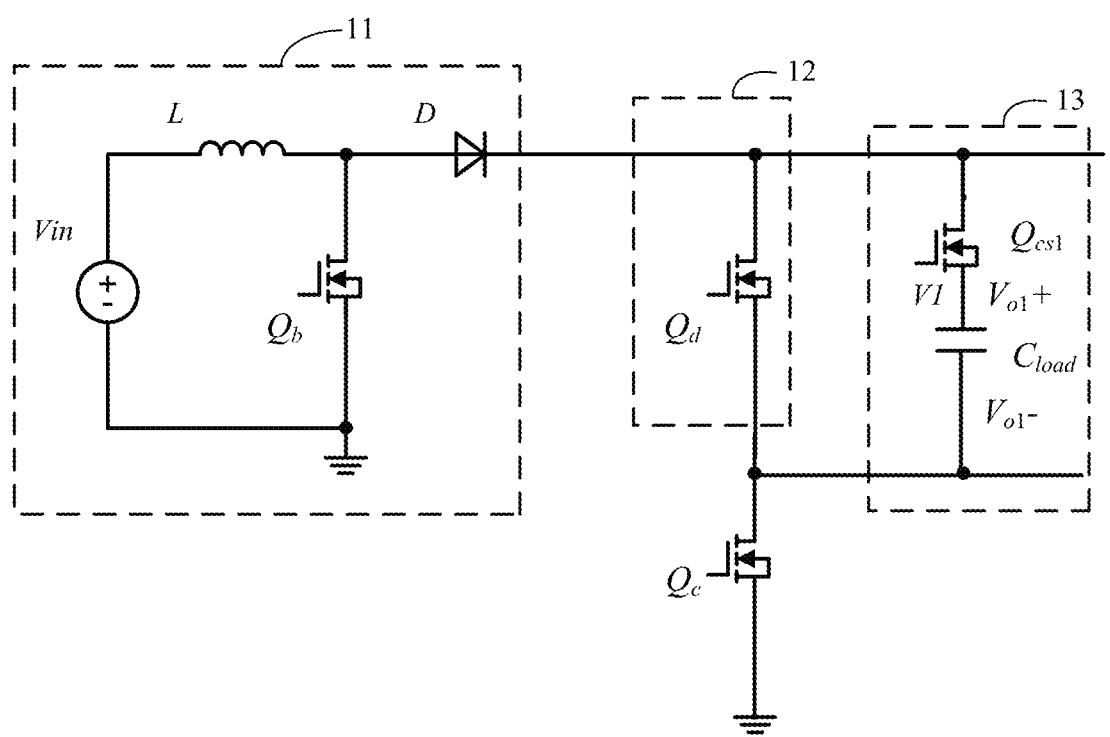
FIG. 9 is a schematic diagram of a driving circuit according to a fourth embodiment of the present disclosure.

FIG. 9 is a schematic diagram of a driving circuit according to a fourth embodiment of the present disclosure. The driving circuit according to the fourth embodiment is different from the driving circuit according to the first embodiment in that: the driving circuit according to the fourth embodiment further includes a first switch $Q_c$, the piezoelectric load $C_{load}$ is connected in series with the selection switch $Q_{cs1}$ to form a branch and the branch is connected in parallel with the discharging switch $Q_d$ in the discharging circuit 12, and the discharging switch $Q_d$ is connected in series with the first switch $Q_c$ to form a branch and the branch is connected between the high potential end of the output ends of the charging circuit 11 and the ground, where the discharging switch $Q_d$ is connected to the high potential end of the output ends of the charging circuit 11, and the first switch $Q_c$ is grounded.

Figure 10:
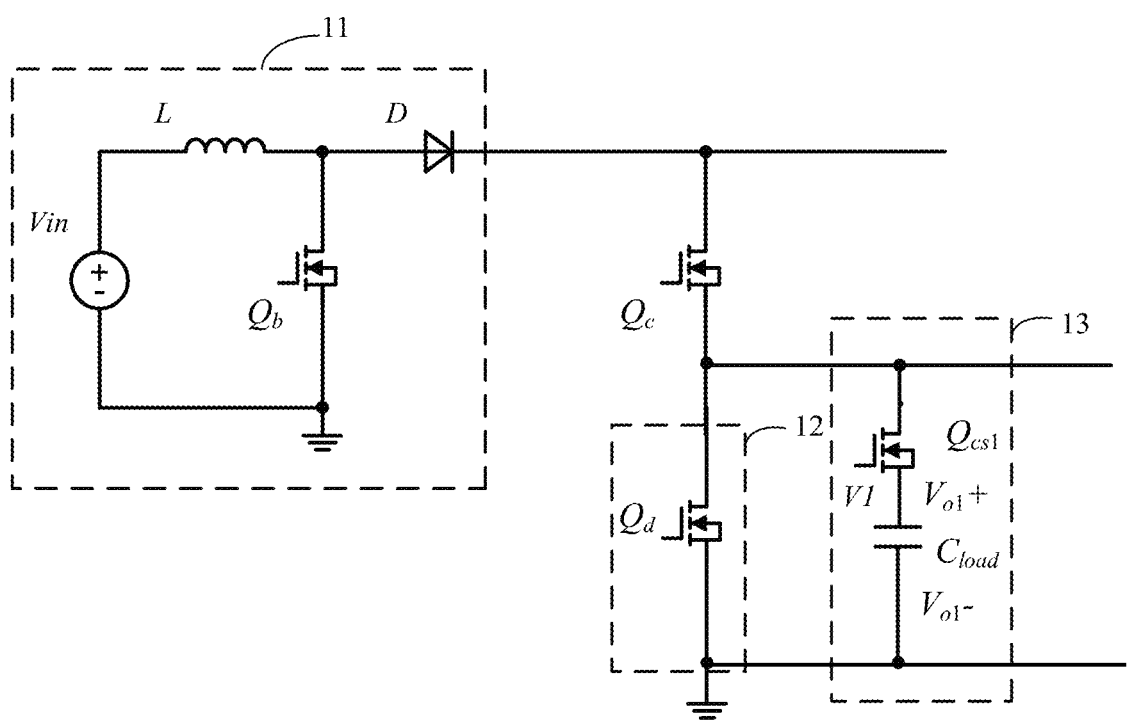
FIG. 10 is a schematic diagram of a driving circuit according to a fifth embodiment of the present disclosure.

FIG. 10 is a schematic diagram of a driving circuit according to a fifth embodiment of the present disclosure. The driving circuit according to the fifth embodiment is different from the driving circuit according to the first embodiment in that: the driving circuit according to the fifth embodiment further includes a first switch $Q_c$, the piezoelectric load $C_{load}$ is connected in series with the selection switch $Q_{cs1}$ to form a branch and the branch is connected in parallel with the discharging switch $Q_d$ in the discharging circuit 12, and the first switch $Q_c$ is connected in series with the discharging switch $Q_d$ to form a branch and the branch is connected between the high potential end of the output ends of the charging circuit 11 and the ground, where the first switch $Q_c$ is connected to the high potential end of the output ends of the charging circuit 11, and the discharging switch $Q_d$ is grounded.

In the fourth embodiment and the fifth embodiment of the present disclosure, the piezoelectric load $C_{load}$ discharges electricity through the discharging circuit 12 during the second operation interval of the operation period, so that the power supply voltage signal in the second operation interval corresponds to the reference voltage in the second interval. When the charging circuit 11 charges the piezoelectric load $C_{load}$, the first switch $Q_c$ is switched on. When the piezoelectric load $C_{load}$ discharges electricity through the discharging circuit 12, the first switch $Q_c$ is switched off. Other details in the fourth embodiment and the fifth embodiment are the same as that in the first embodiment and are not repeated herein.

The driving circuit according to any one of the first embodiment, the second embodiment, the third embodiment, the fourth embodiment and the fifth embodiment of the present disclosure is configured to drive one piezoelectric load. Therefore, the driving circuit includes only one voltage output circuit, that is, the driving circuit has a single output. The driving circuit according to the present disclosure may further be configured to drive multiple piezoelectric loads, that is, the driving circuit has multiple outputs. The driving circuit includes at least two voltage output circuits that are connected in parallel with each other. Each of the at least two voltage output circuits includes a selection switch, and the selection switch is connected in series with a piezoelectric load driven by the voltage output circuit and is switched on or off to control the voltage output circuit to be on or off. For convenience of describing the following embodiments of the present disclosure, the driving circuit includes two outputs to drive two piezoelectric loads. However, the number of output of the driving circuit and the number of piezoelectric loads driven by the driving circuit are not limited in the present disclosure.

Figure 11:
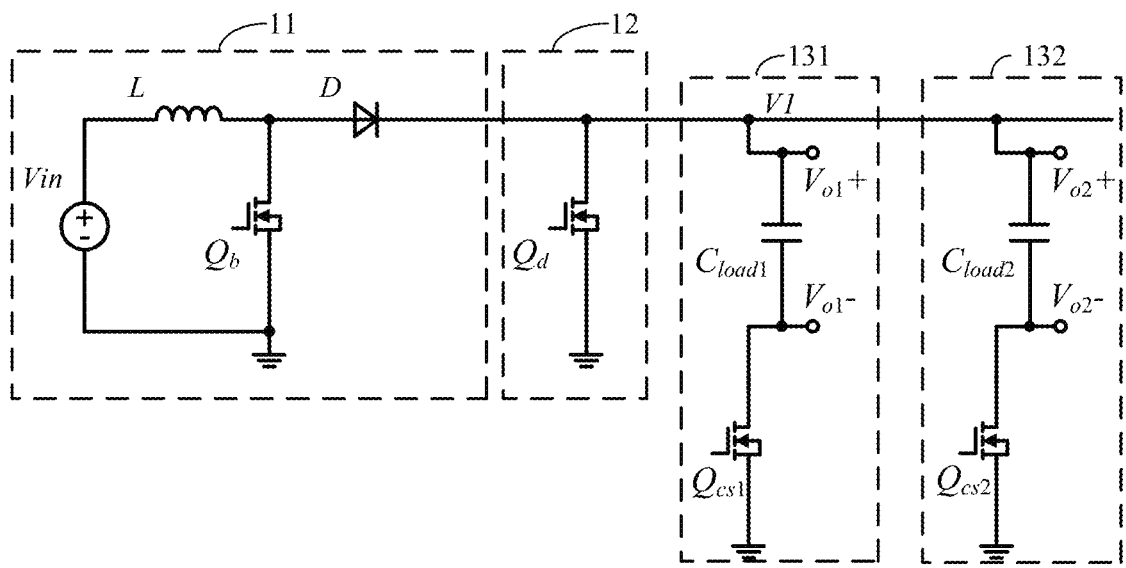
FIG. 11 is a schematic diagram of a driving circuit according to a sixth embodiment of the present disclosure.

FIG. 11 is a schematic diagram of a driving circuit according to a sixth embodiment of the present disclosure. The driving circuit according to the sixth embodiment is different from the driving circuit according to the first embodiment in that: the driving circuit according to the sixth embodiment includes two voltage output circuits, and the two voltage output circuits are connected in parallel with each other.

The driving circuit includes a voltage output circuit 131 and a voltage output circuit 132. The voltage output circuit 131 and the voltage output circuit 132 include a selection switch $Q_{cs1}$ and a selection switch $Q_{cs2}$ respectively. The selection switch $Q_{cs1}$ is controlled to be switched on or off to control the voltage output circuit 131 to be on or off so as to drive or not drive a piezoelectric load $C_{load}$. The selection switch $Q_{cs2}$ is controlled to be switched on or off to control the voltage output circuit 132 to be on or off so as to drive or not drive a piezoelectric load $C_{load2}$.

Figure 12:
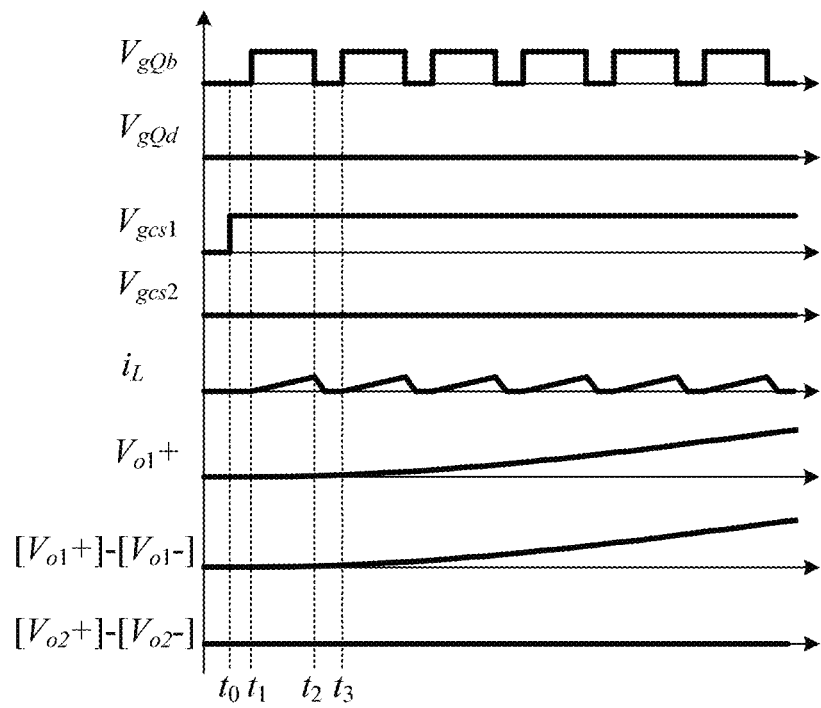
FIG. 12 is a schematic diagram showing operation waveforms of the driving circuit according to the sixth embodiment of the present disclosure during a start-up phase.
Figure 13:
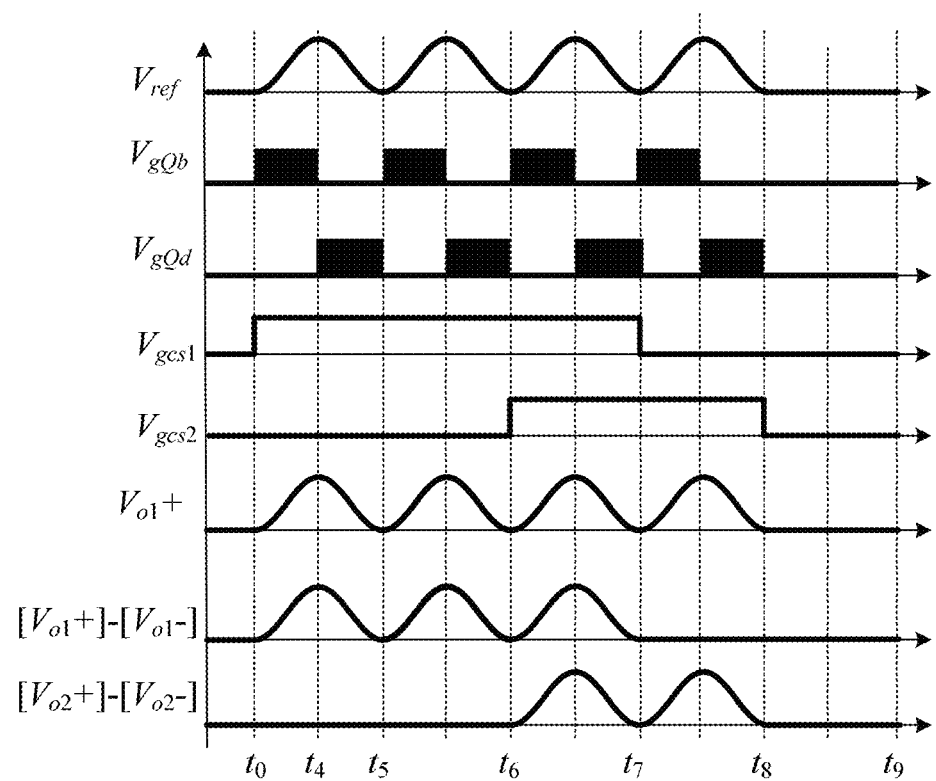
FIG. 13 is a schematic diagram showing operation waveforms of the driving circuit according to the sixth embodiment of the present disclosure.

An operation process of the driving circuit according to the sixth embodiment is described in conjunction with FIG. 11, FIG. 12 and FIG. 13. $V_{gQb}$ represents a driving signal of the switch $Q_b$, $V_{gQd}$ represents a driving signal of the discharging switch $Q_d$, $V_{gcs1}$ represents a driving signal of the selection switch $Q_{cs1}$, $V_{gcs2}$ represents a driving signal of the selection switch $Q_{cs2}$, $i_L$ represents a current passing through the inductor L, Vo1+ represents a voltage of the high potential end of the piezoelectric load, $[V_{o1}+]-[V_{o1}-]$ represents a voltage difference between two ends of the piezoelectric load $C_{load1}$, $[V_{o2}+]-[V_{o2}-]$ represents a voltage difference between two ends of the piezoelectric load $C_{load2}$, and $V_{ref}$ represents a reference voltage. A waveform of the reference voltage is a sine wave with trough value not less than zero. FIG. 12 is a schematic diagram showing operation waveforms of the driving circuit according to the sixth embodiment during a start-up phase. FIG. 13 is a schematic diagram showing operation waveforms of the driving circuit according to the sixth embodiment after the driving circuit operates stably. FIG. 12 shows the operation waveforms during an operation interval from a time instant $t_0$ to a time instant $t_4$ in FIG. 13. The time instant $t_0$ in FIG. 12 and the time instant $t_0$ in FIG. 13 refer to the same time instant, and the time instant $t_4$ is later a time instant $t_3$. Only when the selection switch $Q_{cs1}$ is switched on, a voltage of the low potential end of the piezoelectric load $C_{load1}$ is equal to zero, such that the waveform of $[V_{o1}+]-[V_{o1}-]$ is the same as that of $V_{o1}+$. Only when the selection switch $Q_{cs2}$ is switched on, a voltage of the low potential end of the piezoelectric load $C_{load2}$ is equal to zero, such that the waveform of $[V_{o2}+]-[V_{o2}-]$ is the same as that of $V_{o1}+$.

During an operation interval from the time instant $t_0$ to a time instant $t_7$, $V_{gcs1}$ is at a high level, the selection switch $Q_{cs1}$ is switched on, so that the voltage output circuit 131 is switched on. A waveform of the voltage difference $[V_{o1}+]-[V_{o1}-]$ between two ends of the piezoelectric load $C_{load1}$ is the same as the waveform of the voltage difference $[V_{o1}+]-[V_{o1}-]$ in the first embodiment. In addition, the operation process of the driving circuit according to the sixth embodiment during this operation interval is the same as that in the first embodiment, and is not described in detail here.

During an operation interval from a time instant $t_6$ to a time instant $t_8$, $V_{gcs2}$ is at a high level, the selection switch $Q_{cs2}$ is switched on, so that the voltage output circuit 132 is switched on. A waveform of the voltage difference $[V_{o2}+]-[V_{o2}-]$ between two ends of the piezoelectric load $C_{load2}$ is the same as the waveform of the voltage difference $[V_{o1}+]-[V_{o1}-]$ in the first embodiment. In addition, the operation process of the driving circuit according to the sixth embodiment during this operation interval is the same as that in the first embodiment, and is not described in detail here.

During an operation interval from the time instant $t_6$ to the time instant $t_7$, $V_{gcs1}$ and $V_{gcs2}$ are both at a high level, so that the voltage output circuit 131 and the voltage output circuit 132 are all switched on to drive the piezoelectric load $C_{load1}$ and the piezoelectric load $C_{load2}$ respectively.

During an operation interval from the time instant $t_8$ to a time instant $t_9$, $V_{gcs1}$ and $V_{gcs2}$ are both at a low level, so that the voltage output circuit 131 and the voltage output circuit 132 are all switched off.

Figure 14:
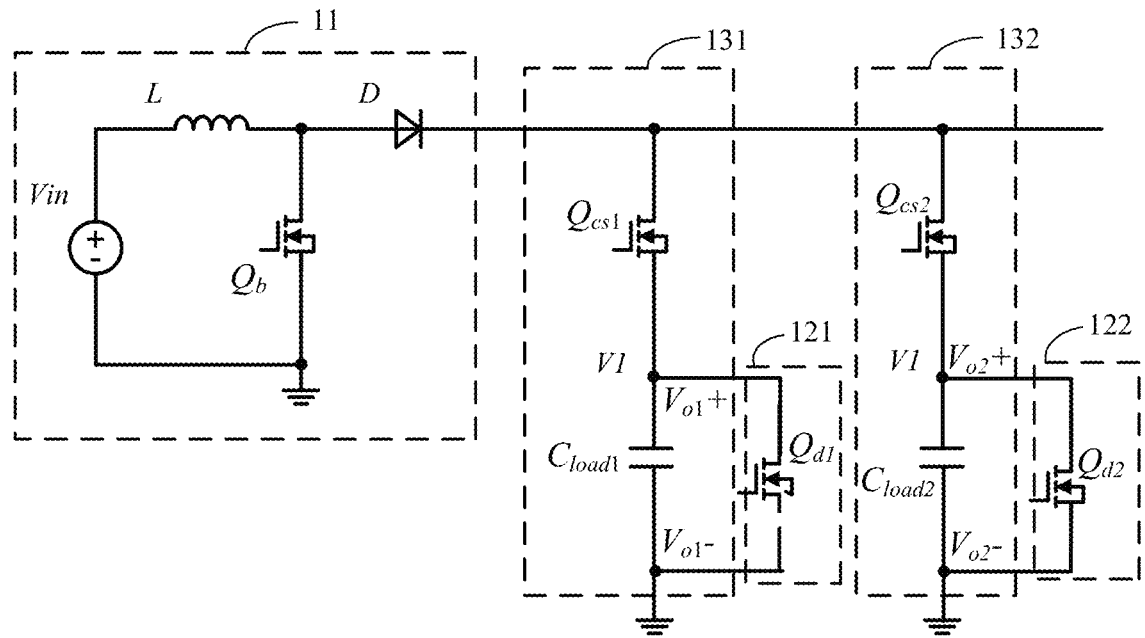
FIG. 14 is a schematic diagram of a driving circuit according to a seventh embodiment of the present disclosure.

FIG. 14 is a schematic diagram of a driving circuit according to a seventh embodiment of the present disclosure. The driving circuit according to the seventh embodiment is different from the driving circuit according to the second embodiment in that: the driving circuit according to the seventh embodiment includes two voltage output circuits and two discharging circuits. The two voltage output circuits are connected in parallel with each other. The two discharging circuits are connected in parallel with respective piezoelectric loads.

Figure 15:
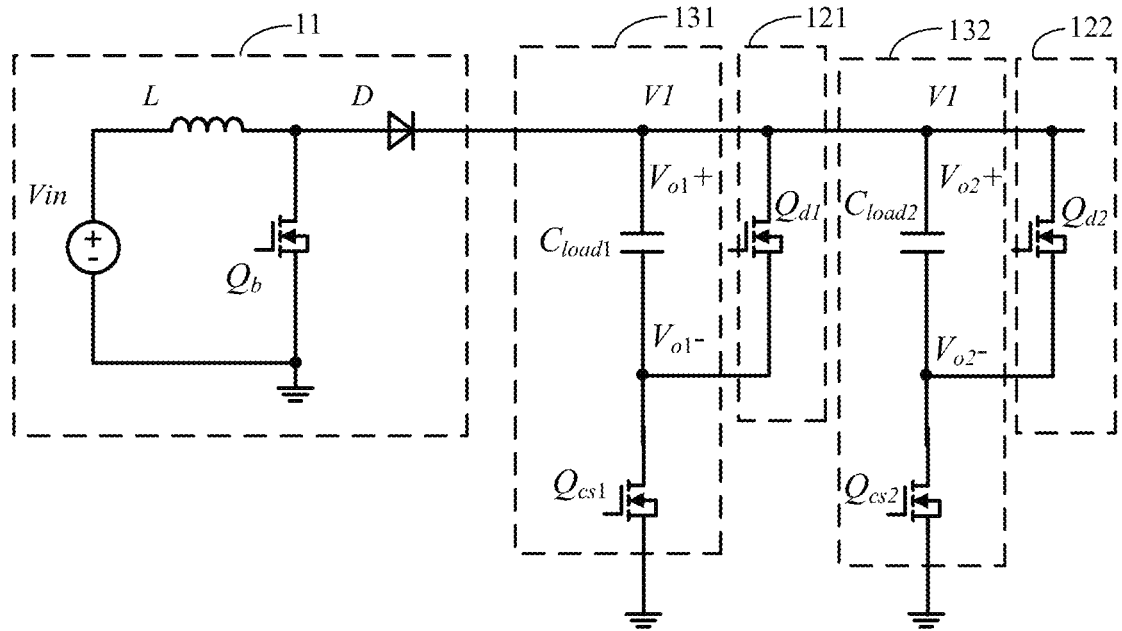
FIG. 15 is a schematic diagram of a driving circuit according to an eighth embodiment of the present disclosure.

FIG. 15 is a schematic diagram of a driving circuit according to an eighth embodiment of the present disclosure. The driving circuit according to the eighth embodiment is different from the driving circuit according to the third embodiment in that: the driving circuit according to the eighth embodiment includes two voltage output circuits and two discharging circuits. The two voltage output circuits are connected in parallel with each other. The two discharging circuits are connected in parallel with respective piezoelectric loads.

In the seventh embodiment and the eighth embodiment of the present disclosure, the driving circuit includes a voltage output circuit 131, a voltage output circuit 132, a discharging circuit 121 and a discharging circuit 122. The voltage output circuit 131 includes a selection switch $Q_{cs1}$. The selection switch $Q_{cs1}$ is connected in series with a piezoelectric load $C_{load1}$. The discharging circuit 121 includes a discharging switch $Q_{d1}$. The discharging switch $Q_{d1}$ is connected in parallel with the piezoelectric load $C_{load1}$. The voltage output circuit 132 includes a selection switch $Q_{cs2}$. The selection switch $Q_{cs2}$ is connected in series with a piezoelectric load $C_{load2}$. The discharging circuit 122 includes a discharging switch $Q_{d2}$. The discharging switch $Q_{d2}$ is connected in parallel with the piezoelectric load $C_{load2}$.

Figure 16:
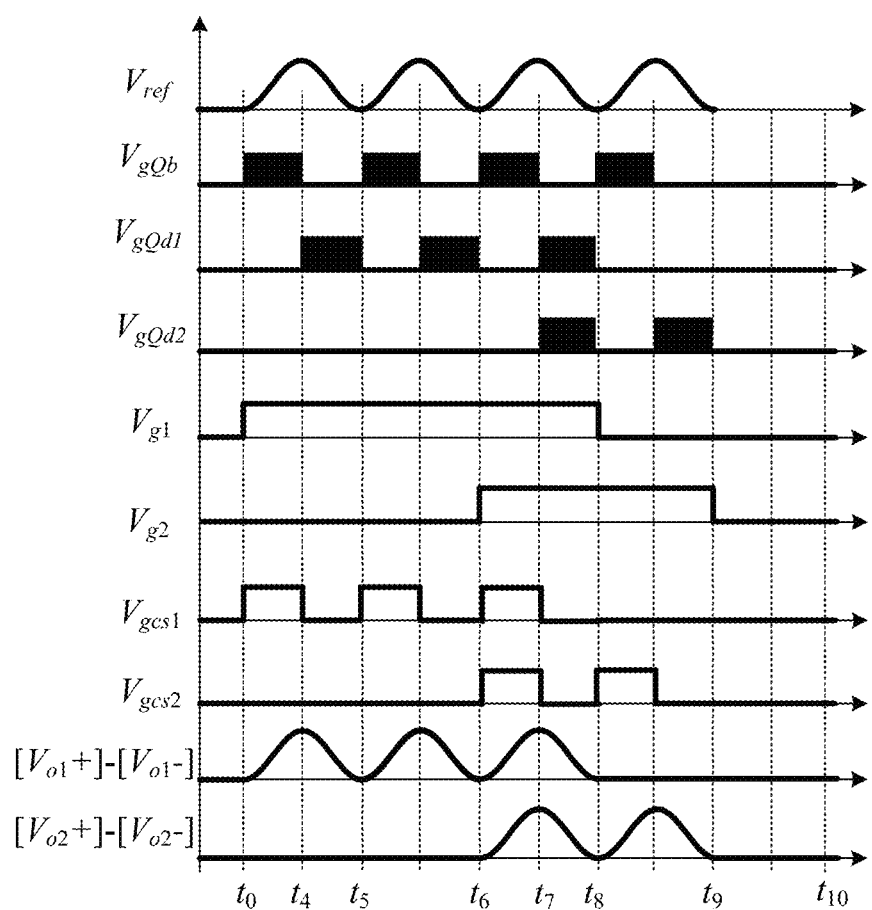
FIG. 16 is a schematic diagram showing operation waveforms of the driving circuit according to the seventh embodiment and the eighth embodiment of the present disclosure.

An operation process of the driving circuit according to the seventh embodiment or the eighth embodiment is described in conjunction with FIG. 14 or FIG. 15, and FIG. 16. $V_{ref}$ represents a reference voltage. A waveform of the reference voltage is a sine wave with a trough value not less than zero. $V_{gQb}$ represents a driving signal of the switch $Q_b$. $V_{gQd1}$ represents a driving signal of the discharging switch $Q_{d1}$. $V_{gQd2}$ represents a driving signal of the discharging switch $Q_{d2}$. $V_{g1}$ represents a path selection signal for indicating whether to drive the piezoelectric load $C_{load1}$. $V_{g2}$ represents a path selection signal for indicating whether to drive the piezoelectric load $C_{load2}$. $V_{gcs1}$ represents a driving signal of the selection switch $Q_{cs1}$. $V_{gcs2}$ represents a driving signal of the selection switch $Q_{cs2}$. $[V_{o1}+]-[V_{o1}-]$ represents a voltage difference between two ends of the piezoelectric load $C_{load1}$. $[V_{o2}+]-[V_{o2}-]$ represents a voltage difference between two ends of the piezoelectric load $C_{load2}$.

In an operation interval from a time instant $t_0$ to a time instant $t_8$, $V_{g1}$ is at a high level, indicating that the piezoelectric load $C_{load1}$ is required to be driven. The voltage output circuit 131 is switched on, and the selection switch $Q_{cs1}$ functions.

During an operation interval from the time instant $t_0$ to a time instant $t_4$, the selection switch $Q_{cs1}$ is switched on, the discharging switch $Q_{d1}$ is switched off, and the main switch $Q_b$ of the charging circuit 11 operates in a PWM mode. During this operation interval, the charging circuit 11 charges the piezoelectric load $C_{load1}$ so that the power supply voltage signal V1 increases with the reference voltage $V_{ref}$ in this operation interval. Therefore, the voltage difference $[V_{o1}+]-[V_{o1}-]$ between two ends of the piezoelectric load $C_{load1}$ during this operation interval is as shown in FIG. 16.

During an operation interval from the time instant $t_4$ to a time instant $t_5$, the selection switch $Q_{cs1}$ is switched off, the main switch $Q_b$ is switched off, and the discharging switch $Q_{d1}$ in the discharging circuit 121 operates in a PWM mode. During this operation interval, the piezoelectric load $C_{load1}$ discharges electricity through the discharging circuit 121 so that the power supply voltage signal V1 decreases with the reference voltage $V_{ref}$ in this operation interval. Therefore, the voltage difference $[V_{o1}+]-[V_{o1}-]$ between two ends of the piezoelectric load $C_{load1}$ during this operation interval is as shown in FIG. 16.

An operation interval from the time instant $t_0$ to the time instant $t_5$ is one operation period. The operation process during the operation interval from the time instant $t_0$ to the time instant $t_5$ is repeated, so that the voltage difference $[V_{o1}+]-[V_{o1}-]$ between the two ends of the piezoelectric load $C_{load1}$ changes with the reference voltage $V_{ref}$, until a time instant $t_8$. From the time instant $t_8$, $V_{g1}$ is at a low level, indicating that the piezoelectric load $C_{load1}$ is no longer required to be driven, the voltage output circuit 131 is cut off, and the selection switch $Q_{cs1}$ does not function.

In an operation interval from a time instant $t_6$ to a time instant $t_9$, $V_{g2}$ is at a high level, indicating that the piezoelectric load $C_{load2}$ is required to be driven. The voltage output circuit 132 is switched on, and the selection switch $Q_{cs2}$ functions.

During an operation interval from the time instant $t_6$ to the time instant $t_7$, the selection switch $Q_{cs2}$ is switched on, the discharging switch $Q_{d2}$ is switched off, and the main switch $Q_b$ operates in a PWM mode. During this operation interval, the charging circuit 11 charges the piezoelectric load $C_{load2}$, so that the power supply voltage signal V1 increases with the reference voltage $V_{ref}$ in this operation interval. Therefore, the voltage difference $[V_{o2}+]-[V_{o2}-]$ between two ends of the piezoelectric load $C_{load2}$ during this operation interval is as shown in FIG. 16.

During an operation interval from the time instant $t_7$ to a time instant $t_8$, the selection switch $Q_{cs2}$ is switched off, the main switch $Q_b$ is switched off, and the discharging switch $Q_{d2}$ of the discharging circuit 122 operates in a PWM mode. During this operation interval, the piezoelectric load $C_{load2}$ discharges electricity through the discharging circuit 122, so that the power supply voltage signal V1 decreases with the reference voltage $V_{ref}$ in this operation interval. Therefore, the voltage difference $[V_{o2}+]-[V_{o2}-]$ between two ends of the piezoelectric load $C_{load2}$ during this operation interval is as shown in FIG. 16.

An operation interval from the time instant $t_6$ to the time instant $t_8$ is one operation period. The operation process during the operation interval from the time instant $t_6$ to the time instant $t_8$ is repeated, so that the voltage difference $[V_{o2}+]-[V_{o2}-]$ between the two ends of the piezoelectric load $C_{load2}$ changes with the reference voltage $V_{ref}$, until a time instant $t_9$. From the time instant $t_9$, $V_{g2}$ is at a low level, indicating that the piezoelectric load $C_{load2}$ is no longer required to be driven, the voltage output circuit 132 is cut off, and the selection switch $Q_{cs2}$ does not function.

During the operation interval from the time instant $t_6$ to the time instant $t_8$, $V_{g1}$ and the $V_{g2}$ are both at a high level. Therefore, the two voltage output circuits are both switched on, and both the selection switch $Q_{cs1}$ and the selection switch $Q_{cs2}$ function to drive the piezoelectric load $C_{load1}$ and the piezoelectric load $C_{load2}$ respectively.

During an operation interval from the time instant $t_9$ to a time instant $t_{10}$, $V_{g1}$ and the $V_{g2}$ are both at a low level. Therefore, the two voltage output circuits are all cut off.

Figure 17:
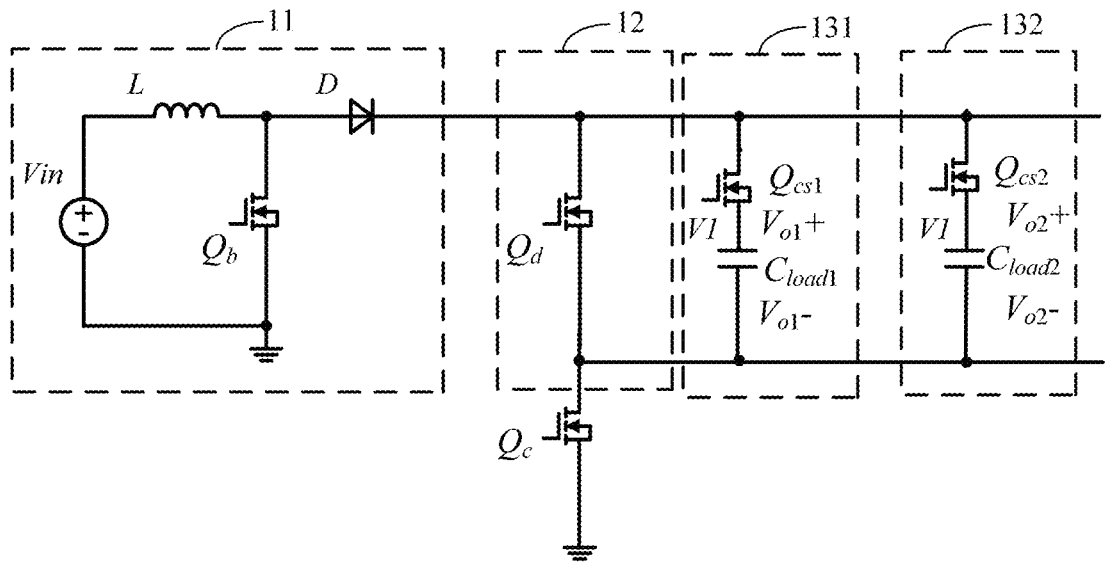
FIG. 17 is a schematic diagram of a driving circuit according to a ninth embodiment of the present disclosure.

FIG. 17 is a schematic diagram of a driving circuit according to a ninth embodiment of the present disclosure. The driving circuit according to the ninth embodiment is different from the driving circuit according to the fourth embodiment in that: the driving circuit according to the ninth embodiment includes two voltage output circuits. The two voltage output circuits are connected in parallel with each other.

Figure 18:
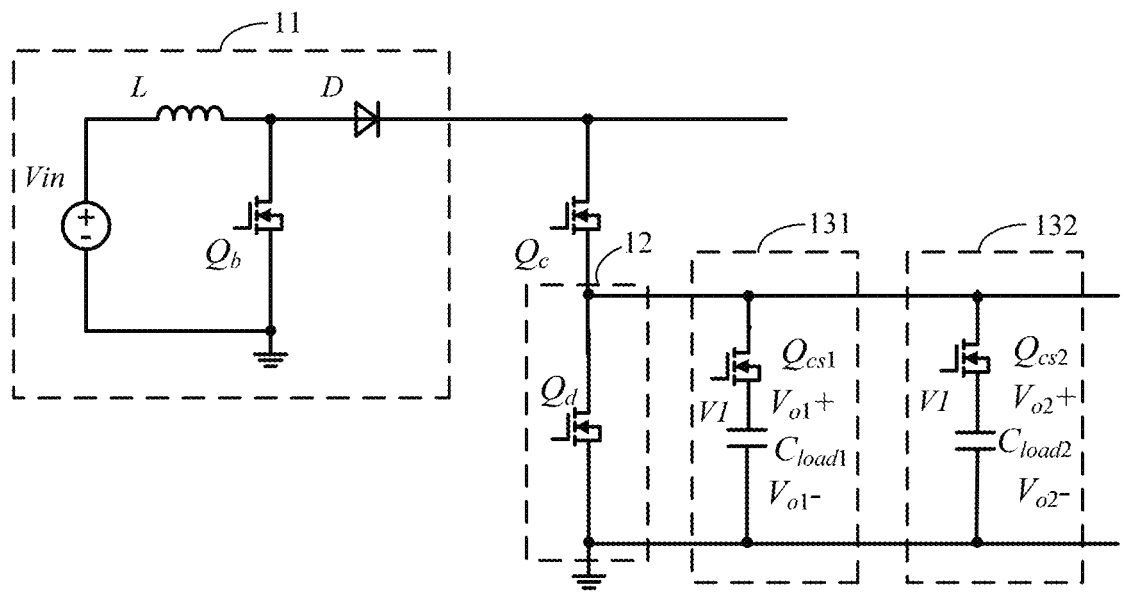
FIG. 18 is a schematic diagram of a driving circuit according to a tenth embodiment of the present disclosure.

FIG. 18 is a schematic diagram of a driving circuit according to a tenth embodiment of the present disclosure. The driving circuit according to the tenth embodiment is different from the driving circuit according to the fifth embodiment in that: the driving circuit according to the tenth embodiment includes two voltage output circuits. The two voltage output circuits are connected in parallel with each other.

The driving circuit according to the ninth embodiment and the tenth embodiment of the present disclosure includes a voltage output circuit 131 and a voltage output circuit 132. The voltage output circuit 131 includes a selection switch $Q_{cs1}$. The selection switch $Q_{cs1}$ is connected in series with a piezoelectric load $C_{load1}$ to form a branch and the branch is connected in parallel with a discharging switch $Q_d$ in a discharging circuit 12. The voltage output circuit 132 includes a selection switch $Q_{cs2}$. The selection switch $Q_{cs2}$ is connected in series with a piezoelectric load $C_{load2}$ to form a branch and the branch is connected in parallel with the discharging switch $Q_d$ in the discharging circuit 12. The first switch $Q_c$ and the discharging switch $Q_d$ are connected in series between the high potential end of the output ends of the charging circuit 11 and the ground.

Figure 19:
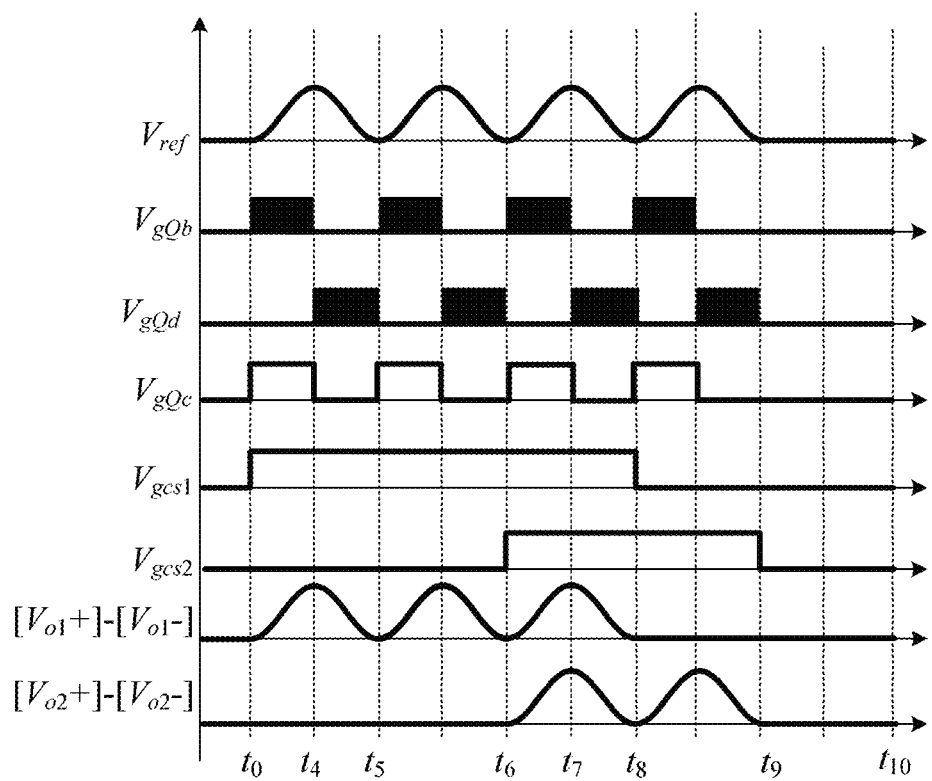
FIG. 19 is a schematic diagram showing operation waveforms of the driving circuit according to the ninth embodiment and the tenth embodiment of the present disclosure.

An operation process of the driving circuit according to the ninth embodiment or the tenth embodiment is described in conjunction with FIG. 17 or FIG. 18, and FIG. 19. $V_{ref}$ represents a reference voltage. A waveform of the reference voltage is a sine wave with a trough value not less than zero. $V_{gQb}$ represents a driving signal of the switch $Q_b$. $V_{gQd}$ represents a driving signal of the discharging switch $Q_d$. $V_{gQc}$ represents a driving signal of the first switch $Q_c$. $V_{gcs1}$ represents a driving signal of the selection switch $Q_{cs1}$. $V_{gcs2}$ represents a driving signal of the selection switch $Q_{cs2}$. $[V_{o1}+]-[V_{o1}-]$ represents a voltage difference between two ends of the piezoelectric load $C_{load1}$. $[V_{o2}+]-[V_{o2}-]$ represents a voltage difference between two ends of the piezoelectric load $C_{load2}$.

During an operation interval from a time instant $t_0$ to a time instant $t_8$, $V_{gcs1}$ is at a high level, so that the selection switch $Q_{cs1}$ is switched on. The voltage output circuit 131 is switched on.

During an operation interval from the time instant $t_0$ to a time instant $t_4$, the first switch $Q_c$ is switched on, the discharging switch $Q_d$ is switched off, and the main switch $Q_b$ operates in a PWM mode. During this operation interval, the charging circuit 11 charges the piezoelectric load $C_{load1}$, so that the power supply voltage signal V1 increases with the reference voltage $V_{ref}$ in this operation interval. Therefore, the voltage difference $[V_{o1}+]-[V_{o1}-]$ between two ends of the piezoelectric load $C_{load1}$ during this operation interval is as shown in FIG. 19.

During an operation interval from the time instant $t_4$ to a time instant $t_5$, the first switch $Q_c$ is switched off, the main switch $Q_b$ is switched off, and the discharging switch $Q_d$ operates in a PWM mode. During this operation interval, the piezoelectric load $C_{load1}$ discharges electricity through the discharging circuit 12, so that the power supply voltage signal V1 decreases with the reference voltage $V_{ref}$ in this operation interval. Therefore, the voltage difference $[V_{o1}+]-[V_{o1}-]$ between two ends of the piezoelectric load $C_{load1}$ during this operation interval is as shown in FIG. 19.

An operation interval from the time instant $t_0$ to the time instant $t_5$ is one operation period. The operation process from the time instant $t_0$ to the time instant $t_5$ is repeated, so that the voltage difference $[V_{o1}+]-[V_{o1}-]$ between two ends of the piezoelectric load $C_{load1}$ changes with the reference voltage $V_{ref}$, until the time instant $t_8$. From the time instant $t_8$, $V_{gcs1}$ is at a low level, so that the selection switch $Q_{cs1}$ is switched off. Therefore, the voltage output circuit 131 is cut off.

During an operation interval from a time instant $t_6$ to a time instant $t_9$, $V_{gcs2}$ is at a high level, so that the selection switch $Q_{cs2}$ is switched on, and the voltage output circuit 132 is switched on.

During an operation interval from the time instant $t_6$ to a time instant $t_7$, the first switch $Q_c$ is switched on, the discharging switch $Q_d$ is switched off, and the main switch $Q_b$ operates in a PWM mode. During this operation interval, the charging circuit 11 charges the piezoelectric load $C_{load2}$, so that the power supply voltage signal V1 increases with the reference voltage $V_{ref}$ in this operation interval. Therefore, the voltage difference $[V_{o2}+]-[V_{o2}-]$ between two ends of the piezoelectric load $C_{load2}$ during this operation interval is as shown in FIG. 19.

During an operation interval from the time instant $t_7$ to the time instant $t_8$, the first switch $Q_c$ is switched off, the main switch $Q_b$ is switched off, and the discharging switch $Q_d$ operates in a PWM mode. During this operation interval, the piezoelectric load $C_{load2}$ discharges electricity through the discharging circuit 12, so that the power supply voltage signal V1 decreases with the reference voltage $V_{ref}$ in this operation interval. Therefore, the voltage difference $[V_{o2}+]-[V_{o2}-]$ between two ends of the piezoelectric load $C_{load2}$ during this operation interval is as shown in FIG. 19.

An operation interval from the time instant $t_6$ to the time instant $t_8$ is one operation period. The operation process from the time instant $t_6$ to the time instant $t_8$ is repeated, so that the voltage difference $[V_{o2}+]-[V_{o2}-]$ between two ends of the piezoelectric load $C_{load2}$ changes with the reference voltage $V_{ref}$, until a time instant $t_9$. From the time instant $t_9$, $V_{gcs2}$ is at a low level, so that the selection switch $Q_{cs2}$ is switched off, and the voltage output circuit 132 is cut off.

During the operation interval from the time instant $t_6$ to the time instant $t_8$, $V_{gcs1}$ and the $V_{gcs2}$ are both at a high level, such that the two voltage output circuits are both switched on. The selection switch $Q_{cs1}$ and the selection switch $Q_{cs2}$ are both switched on to drive the piezoelectric load $C_{load1}$ and the piezoelectric load $C_{load2}$ respectively.

During an operation interval from the time instant $t_9$ to a time instant $t_{10}$, $V_{gcs1}$ and $V_{gcs2}$ are both at a low level, such that the two voltage output circuits are both cut off.

Figure 20:
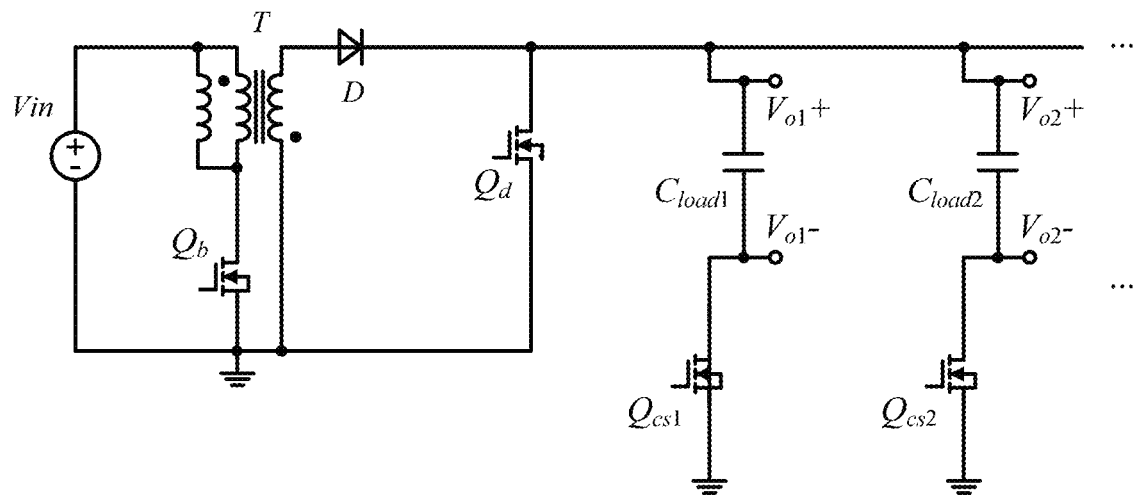
FIG. 20 is a schematic diagram of a driving circuit according to an eleventh embodiment of the present disclosure.
Figure 21:
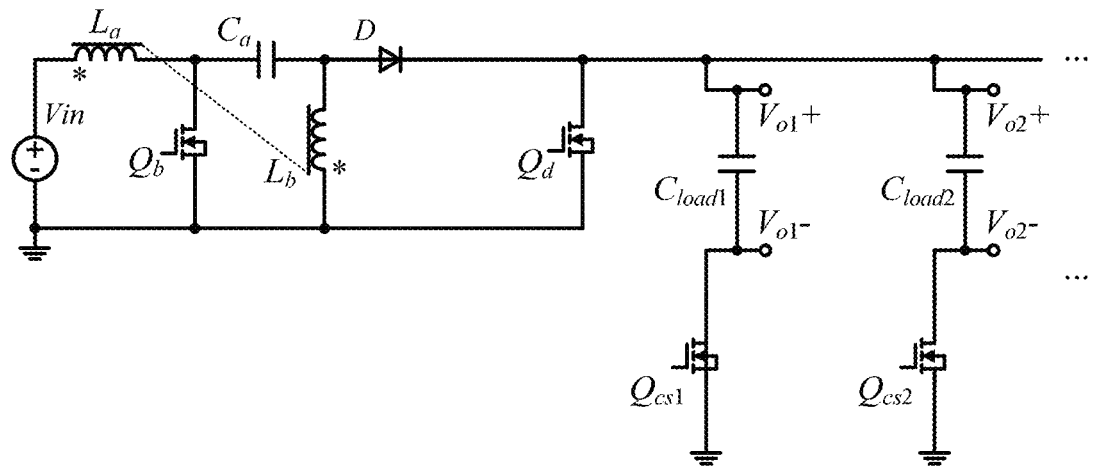
FIG. 21 is a schematic diagram of a driving circuit according to a twelfth embodiment of the present disclosure.

It should be noted that the charging circuit according to the first embodiment to the tenth embodiment is a boost circuit. However, the charging circuit is not limited in the present disclosure. The charging circuit can be a buck circuit, a flyback circuit (as shown in FIG. 20), a forward circuit, a boost-buck circuit (as shown in FIG. 21) or a buck-boost circuit.

Figure 22:
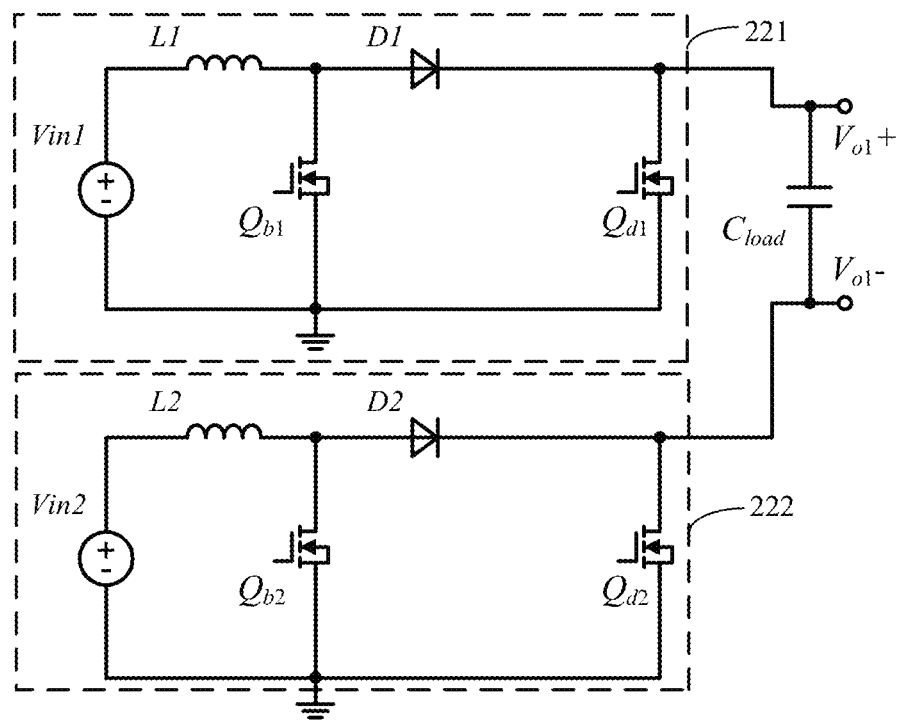
FIG. 22 is a schematic diagram of a driving circuit according to a thirteenth embodiment of the present disclosure.

FIG. 22 is a schematic diagram of a driving circuit according to a thirteenth embodiment of the present disclosure. The driving circuit according to the thirteenth embodiment is different from the driving circuit according to the first embodiment in that: one end of a piezoelectric load $C_{load}$ is connected to a high potential end of a discharging circuit in a driving circuit 221, and the other end of the piezoelectric load $C_{load}$ is connected to a high potential end of a discharging circuit in a driving circuit 222.

By controlling power supply voltage signals from the driving circuit 221 and the driving circuit 222, a voltage across the piezoelectric load is an alternating current voltage. In an embodiment, the power supply voltage signals from the driving circuit 221 and the driving circuit 222 during two consecutive operation periods sequentially correspond to the reference voltage during two consecutive periods, respectively. For example, the supply voltage signal from the driving circuit 221 during a current operation period corresponds to the reference voltage during the current period, and the supply voltage signal from the driving circuit 222 during a next operation period corresponds to the reference voltage during the next period.

It should be noted that each of the driving circuit 221 and the driving circuit 222 according to the thirteenth embodiment may be the driving circuit according any one of the second embodiment to the fifth embodiment. The thirteenth embodiment is described by taking a case in which each of the driving circuit 221 and the driving circuit 222 is the driving circuit according to the first embodiment. However, structures of the driving circuit 221 and the driving circuit 222 are not limited in the present disclosure.

An operation process of the driving circuits according to the thirteenth embodiment is described in conjunction with FIG. 22, FIG. 23, and FIG. 24A to FIG. 24D. $V_{ref}$ represents a reference voltage, and a waveform of the reference voltage is a sine wave with a trough value not less than zero. $V_{gQb1}$ and $V_{gQb2}$ represent a driving signal of a switch $Q_{b1}$ and a driving signal of a switch $Q_{b2}$ respectively. $V_{gQ1}$, and $V_{gQd2}$ represent a driving signal of the switch $Q_{d1}$ and a driving signal of the switch $Q_{d2}$ respectively. $V_{o1}+$ represents the power supply voltage signal from the driving circuit 221. $V_{o1}-$ represents the power supply voltage signal from the driving circuit 222. $[V_{o1}+]-[V_{o1}-]$ represents a voltage difference between two ends of the piezoelectric load $C_{load}$.

Figure 23:
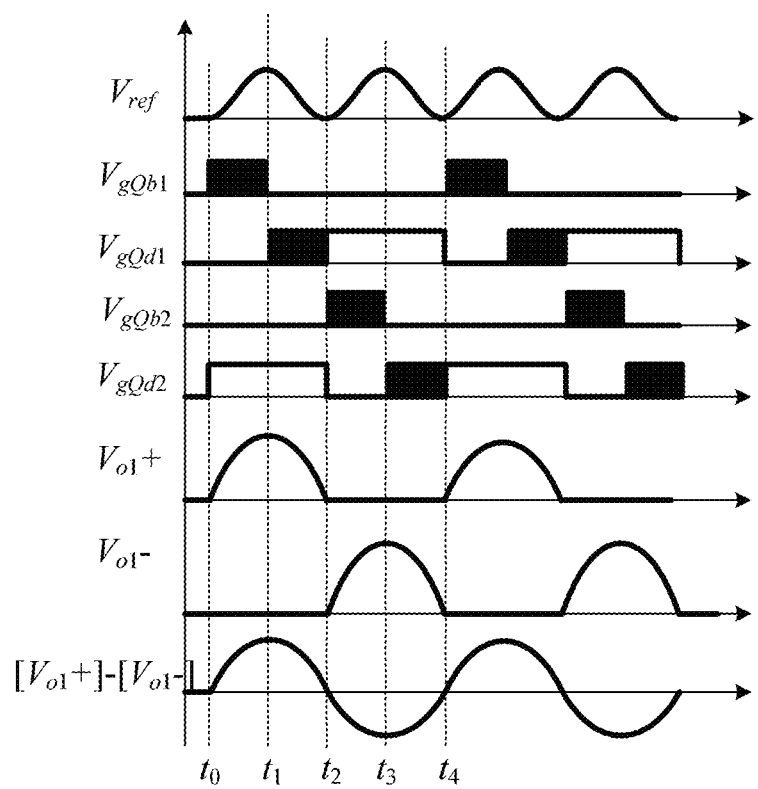
FIG. 23 is a schematic diagram showing operation waveforms of the driving circuit according to the thirteenth embodiment of the present disclosure.
Figure 24A:
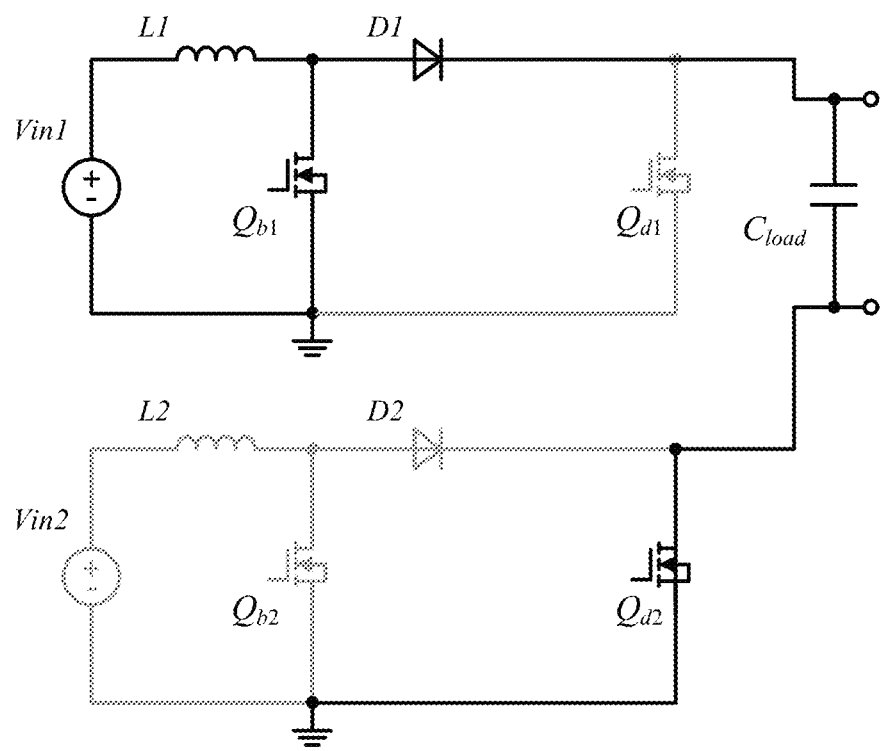
FIG. 24A to FIG. 24D are schematic diagrams showing operation states of the driving circuit according to the thirteenth embodiment of the present disclosure during operation intervals respectively.

As shown in FIG. 23, during an operation interval from a time instant $t_0$ to a time instant $t_1$, $V_{gQb1}$ is a PWM signal and $V_{gQd2}$ is at a high level, so that the switch $Q_{b1}$ operates in a PWM mode and the switch $Q_{d2}$ is switched on. The driving circuits according to the thirteenth embodiment operate as shown in FIG. 24A. The supply voltage signal $V_{o1}+$ from the driving circuit 221 increases with the reference voltage $V_{ref}$.

Figure 24B:
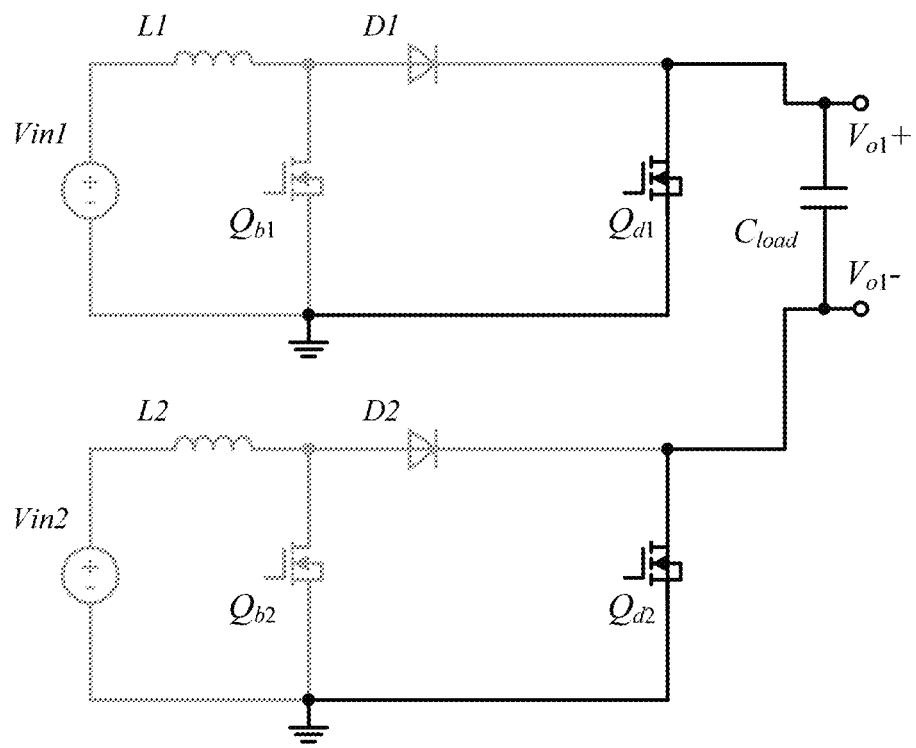

During an operation interval from the time instant $t_1$ to a time instant $t_2$, $V_{gQb1}$ is at a low level, $V_{gQd1}$ is a PWM signal, and $V_{gQd2}$ is at a high level, so that the switch $Q_{b1}$ is switched off, the switch $Q_{d1}$ operates in a PWM mode, and the switch $Q_{d2}$ is switched on. The driving circuits according to the thirteenth embodiment operate as shown in FIG. 24B. The power supply voltage signal $V_{o1}+$ from the driving circuit 221 decreases with the reference voltage $V_{ref}$.

Figure 24C:
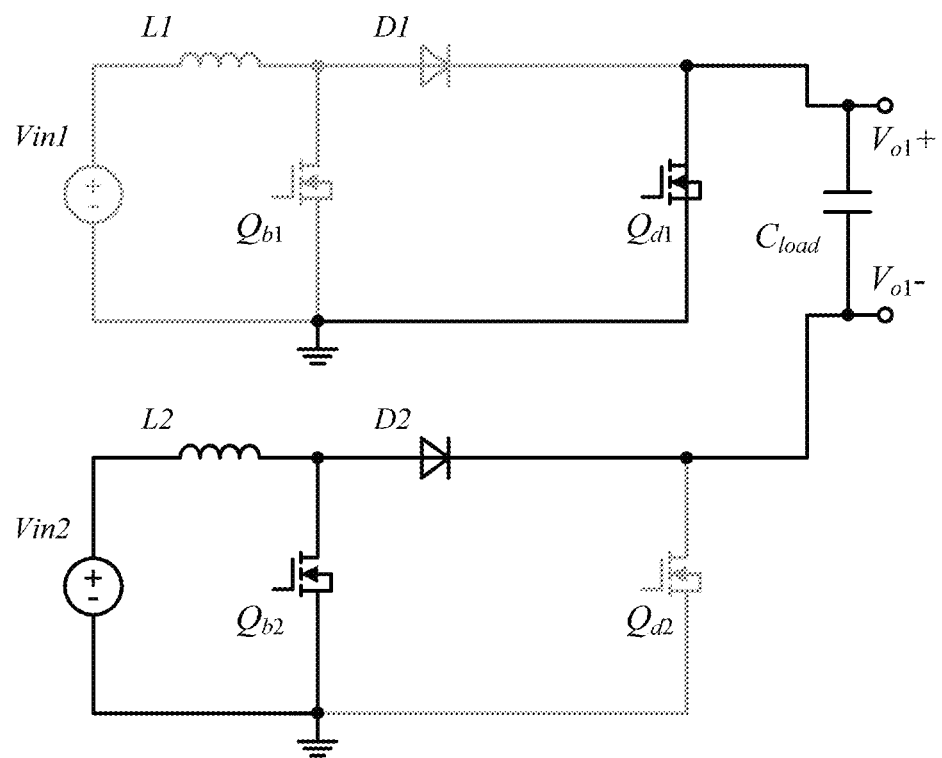

During an operation interval from the time instant $t_2$ to a time instant $t_3$, $V_{gQb2}$ is a PWM signal and $V_{gQd1}$ is at a high level, so that the switch $Q_{b2}$ operates in the PWM mode and the switch $Q_{d1}$ is switched on. The driving circuits according to the thirteenth embodiment operate as shown in FIG. 24C. The supply voltage signal $V_{o1}-$ from the driving circuit 222 increases with the reference voltage $V_{ref}$.

Figure 24D:
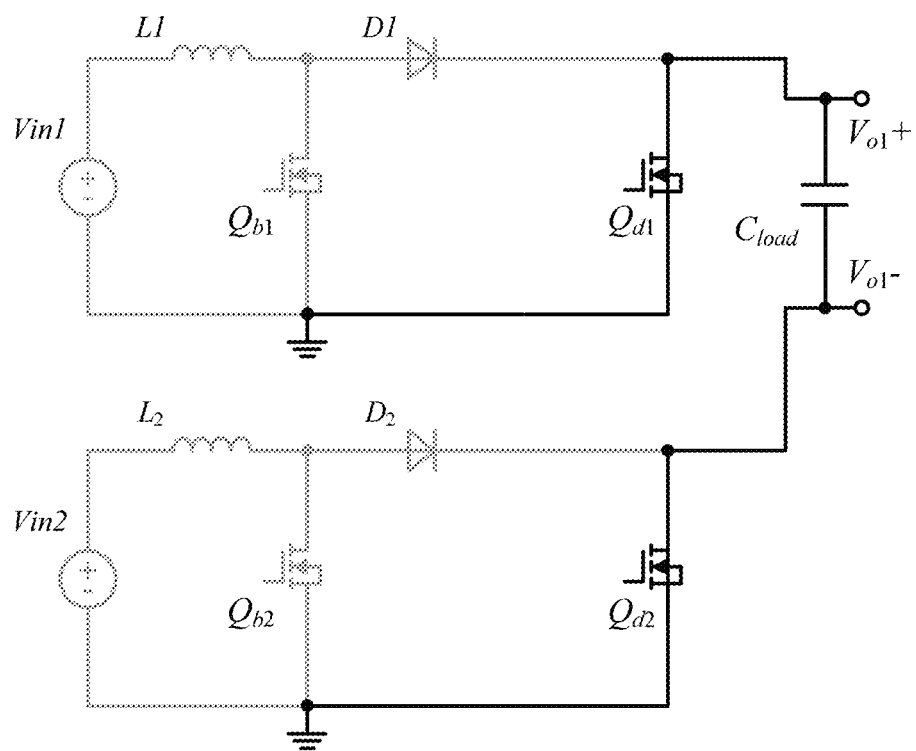

During an operation interval from the time instant $t_3$ to a time instant $t_4$, $V_{gQb2}$ is at a low level, $V_{gQd2}$ is a PWM signal, and $V_{gQd1}$ is at a high level, so that the switch $Q_{b2}$ is switched off, the switch $Q_{d2}$ operates in a PWM mode, and the switch $Q_{d1}$ is switched on. The driving circuits according to the thirteenth embodiment operate as shown in FIG. 24D. The supply voltage signal $V_{o1}-$ from the driving circuit 222 decreases with the reference voltage $V_{ref}$.

During an operation interval from the time instant $t_0$ to the time instant $t_2$, the power supply voltage signal $V_{o1}+$ from the driving circuit 221 changes with the reference voltage $V_{ref}$ during this operation interval, and the power supply voltage signal $V_{o1}-$ from the driving circuit 222 is equal to 0. During an operation interval from the time instant $t_2$ to the time instant $t_4$, the power supply voltage signal $V_{o1}-$ from the driving circuit 222 changes with the reference voltage $V_{ref}$ during this operation interval, and the power supply voltage signal $V_{o1}+$ from the driving circuit 221 is equal to 0. During an operation interval from the time instant $t_0$ to the time instant $t_4$, a waveform of the voltage difference $[V_{o1}+]-[V_{o1}-]$ between two ends of the piezoelectric load $C_{load}$ is a sine wave.

The operation process during the operation interval from the time instant $t_0$ to the time instant Li is repeated, so that the power supply voltage signals from the driving circuit 221 and the driving circuit 222 change with the reference voltage $V_{ref}$.

In a case that the piezoelectric load is not required to be driven, voltages at two ends of the piezoelectric load are controlled to be equal. That is, the voltage difference between two ends of the piezoelectric load is controlled to be zero.

Figure 25:
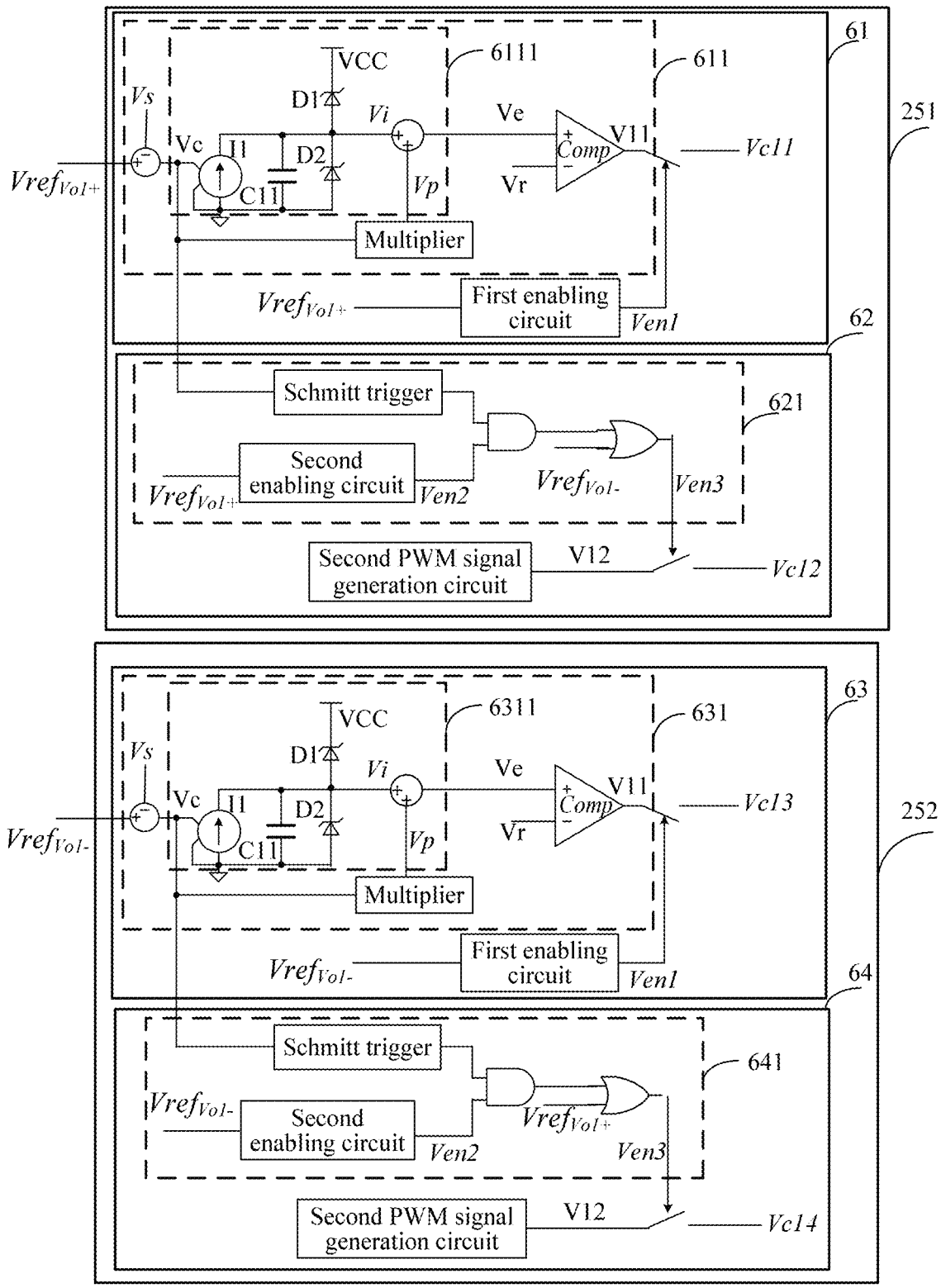
FIG. 25 is a schematic diagram of a control circuit of the driving circuit according to the thirteenth embodiment of the present disclosure.

FIG. 25 is a schematic diagram of a control circuit of the driving circuit according to the thirteenth embodiment of the present disclosure. The control circuit include a first control circuit 251 and a second circuit 252. The first control circuit 251 is configured to control the operation states of the driving circuit 221 in the thirteenth embodiment. The second control circuit 252 is configured to control the operation states of the driving circuit 222 in the thirteenth embodiment.

The first control circuit 251 and the second control circuit 252 are different from the control circuit according to the first embodiment shown in FIG. 6 in the following aspects.

In a first aspect, reference voltages of the first control circuit 251 and the second control circuit 252 are different from the reference voltage of the control circuit according to the first embodiment.

A sum of a reference voltage $Vref_{Vo1-}$ of the first control circuit 251 and a reference voltage $Vref_{Vo1}$ of the second control circuit 252 is equal to the reference voltage $V_{ref}$ of the control circuit according to the first embodiment. The reference voltage $Vref_{Vo1+}$ of the first control circuit 251 and the reference voltage $Vref_{Vo1-}$ of the second control circuit 252 correspond to the reference voltage $V_{ref}$ of the control circuit according to the first embodiment in two consecutive periods, respectively.

In a second aspect, an enabling module 621 in a second PWM control circuit 62 in the first control circuit 251 further includes an OR gate. The OR gate receives an output signal of an AND gate and the reference voltage $Vref_{Vo1-}$ of the second control circuit 252, to generate an enabling signal Ven3 to control a second control signal Vc12 outputted by the second PWM control circuit 62, so as to control a switch $Q_{d1}$ in the discharging circuit in the driving circuit 221 to be switched on or off.

In a third aspect, an enabling module 641 in a second PWM control circuit 64 in the second control circuit 252 further includes an OR gate. The OR gate receives an output signal of an AND gate and the reference voltage $Vref_{Vo1+}$ of the first control circuit 251 to generate an enabling signal Ven3 to control a second control signal Vc14 outputted by the second PWM control circuit 64, so as to control a switch $Q_{d2}$ in the discharging circuit in the driving circuit 222 to be switched on or off.

The driving circuit according to the thirteenth embodiment drives only one piezoelectric load, that is, the driving circuit includes a single output. The driving circuit according to the thirteenth embodiment of the present disclosure is further configured to drive multiple piezoelectric loads. In a case that (N−1) piezoelectric loads are required to be driven, N driving circuits are required to provide N power supply voltage signals for the (N−1) piezoelectric loads. For each of the (N−1) piezoelectric load, two ends of the piezoelectric load are respectively connected to high potential ends of discharging circuits in two of the N driving circuits. Power supply voltage signals from the two driving circuits are controlled so that a voltage across the piezoelectric load is an alternating current voltage.

In an embodiment, the two power supply voltage signals from the two driving circuits connected to the two ends of the piezoelectric load in two consecutive operation periods correspond to the reference voltage in two consecutive periods respectively.

In an embodiment, first ends of the (N−1) piezoelectric loads are connected to a same driving circuit, and second ends of the (N−1) piezoelectric loads are respectively connected to the other N−1 driving circuits.

Figure 26:
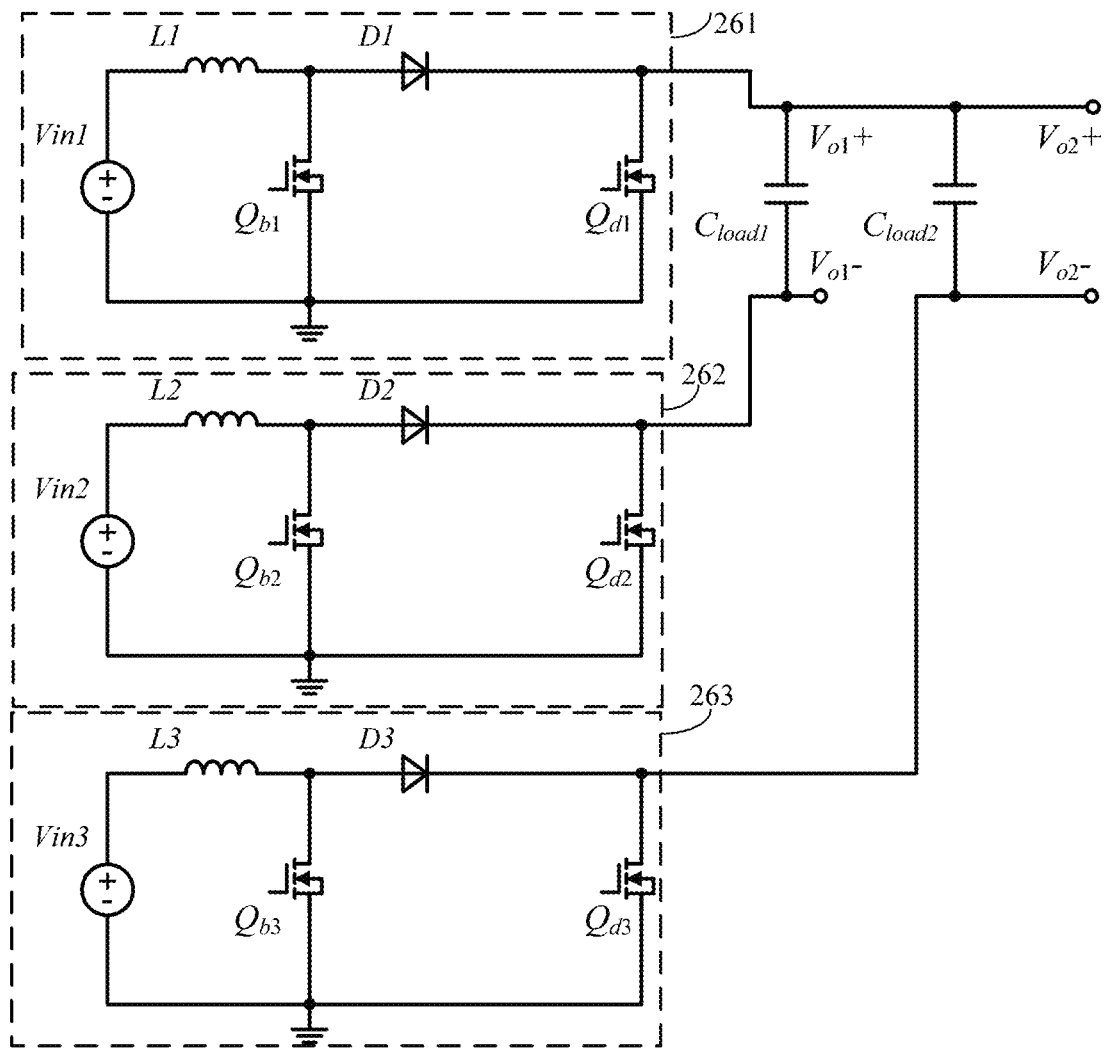
FIG. 26 is a schematic diagram of a driving circuit according to a fourteenth embodiment of the present disclosure.

For ease of description, in the present disclosure, a case in which the driving circuit according to the present disclosure drives two piezoelectric loads is taking as an example. However, the present is not limited to the case. Reference is made to FIG. 26, which is a schematic diagram of a driving circuit according to a fourteenth embodiment of the present disclosure. The driving circuit according to the fourteenth embodiment is different from the driving circuits according to the thirteenth embodiment in that: the driving circuit according to the fourteenth embodiment includes three driving circuits to drive two piezoelectric loads.

The driving circuit according to the fourteenth embodiment includes a driving circuit 261, a driving circuit 262 and a driving circuit 263. An end of the piezoelectric load $C_{load1}$ and an end of the piezoelectric load $C_{Load2}$ are connected to the driving circuit 261. The other end of the piezoelectric load $C_{load1}$ and the other end of the piezoelectric load $C_{Load2}$ are connected to the driving circuit 262 and the driving circuit 263 respectively.

Figure 27:
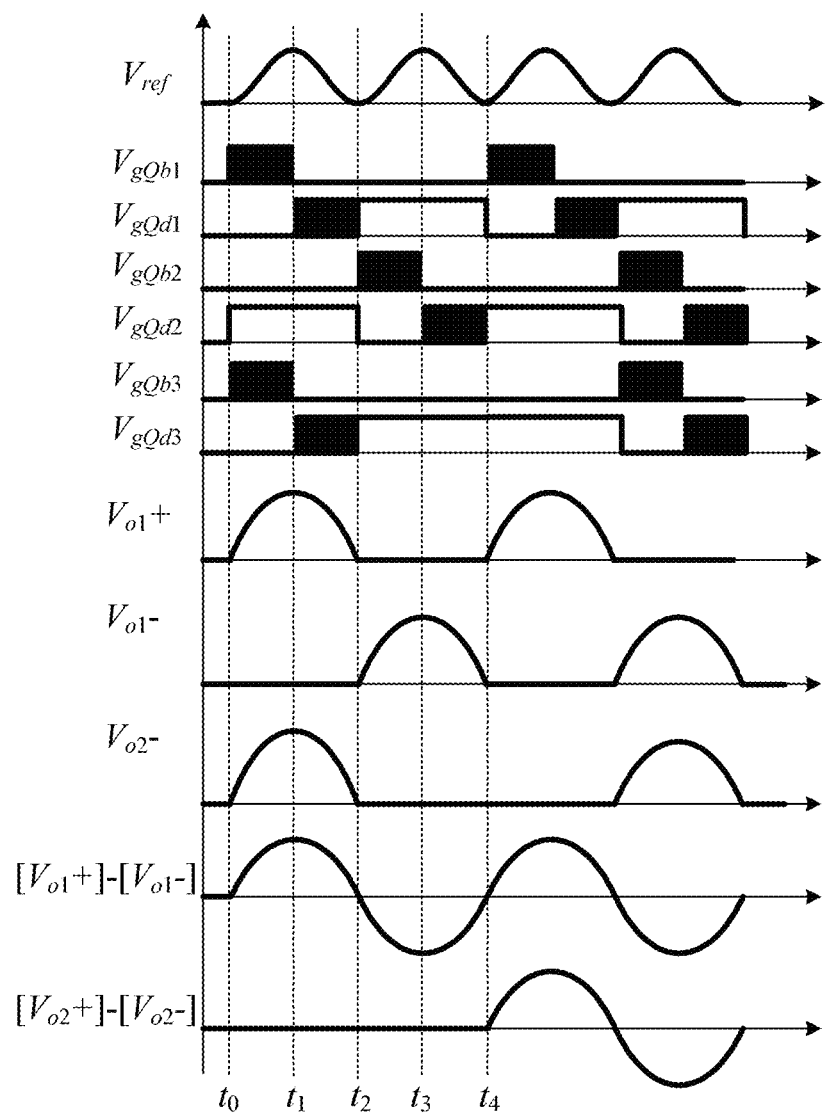
FIG. 27 is a schematic diagram showing operation waveforms of the driving circuit according to the fourteenth embodiment of the present disclosure.

Operation waveforms of the driving circuit according to the fourteenth embodiment are as shown in FIG. 27. When driving one of the piezoelectric loads, the driving circuit operates the same as the driving circuit according to the thirteenth embodiment, which is not repeated here. In a case that the piezoelectric load is not required to be driven, voltages of two ends of the piezoelectric load are controlled to be equal. That is, a voltage difference between two ends of the piezoelectric load is controlled to be zero.

Figure 28:
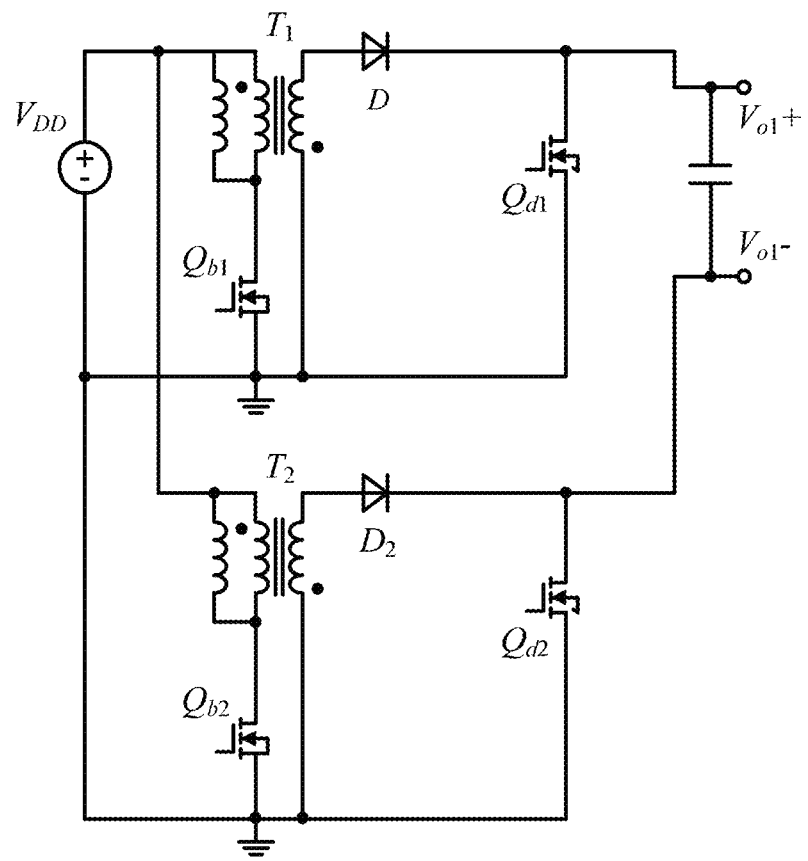
FIG. 28 is a schematic diagram of a driving circuit according to a fifteenth embodiment of the present disclosure.
Figure 29:
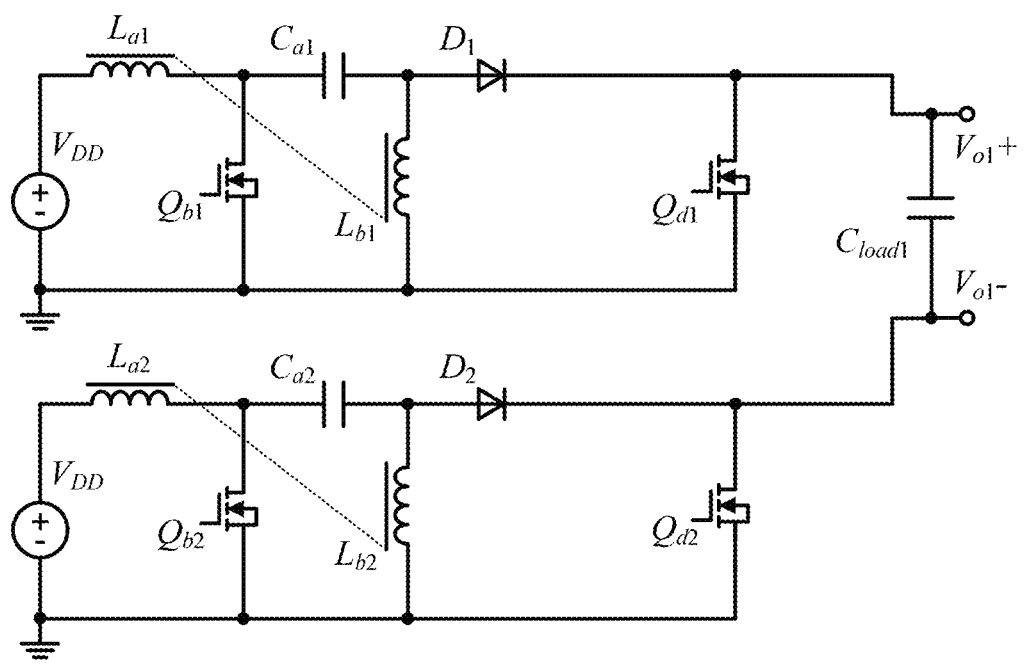
FIG. 29 is a schematic diagram of a driving circuit according to a sixteenth embodiment of the present disclosure.

It should be noted that the charging circuit in the thirteenth embodiment and the fourteenth embodiment is a boost circuit. However, the charging circuit is not limited in the present disclosure. The charging circuit may be one of a buck circuit, a flyback circuit (as shown in FIG. 28), a forward circuit, a boost-buck circuit (as shown in FIG. 29) and a buck-boost circuit. In addition, in the thirteenth embodiment and the fourteenth embodiment, charging circuits in two driving circuits respectively connected to two ends of a piezoelectric load are identical. In other embodiments, charging circuits in two driving circuits respectively connected to two ends of a piezoelectric load are different. For example, a charging circuit in a driving circuit connected to one end of the piezoelectric load is a boost circuit, and a charging circuit in another driving circuit connected to the other end of the piezoelectric load is a flyback circuit.

In the second embodiment, the third embodiment, the seventh embodiment and the eighth embodiment of the present disclosure, voltage output circuits are coupled to discharging circuits in one to one correspondence, so that requirement of instantaneous current flowing through the discharging circuit is low.

A driving method is further provided according to the present disclosure. The driving method is based on a driving circuit. The driving circuit includes a charging circuit and a discharging circuit. The charging circuit is configured to receive an input voltage to charge a piezoelectric load. The piezoelectric load discharges electricity through the discharging circuit.

During a first operation interval of an operation period, operation states of the charging circuit and the discharging circuit are controlled, so that a power supply voltage signal provided to the piezoelectric load in the first operation interval corresponds to a reference voltage in a first interval.

During a second operation interval of the operation period, operation states of the charging circuit and the discharging circuit are controlled, so that the power supply voltage signal in the second operation interval corresponds to the reference voltage in a second interval.

In an embodiment, during the first operation interval, the discharging circuit is controlled to be cut off and the charging circuit is controlled to operate so that the power supply voltage signal corresponds to the reference voltage in the first interval. During the second operation interval, the charging circuit is controlled to be cut off and the discharging circuit is controlled to operate so that the power supply voltage signal corresponds to the reference voltage in the second interval.

In an embodiment, during the first operation interval, the discharging circuit is controlled to be cut off, and the charging circuit operates in a PWM control mode to charge the piezoelectric load.

In an embodiment, during the second operation interval, the charging circuit is controlled to be cut off, and the discharging circuit operates in a PWM control mode so that the piezoelectric load discharges electricity through the discharging circuit.

In an embodiment, for each of the piezoelectric loads, two ends of the piezoelectric load are respectively connected to high potential ends of two discharging circuits. Power supply voltage signals respectively provided for two ends of the piezoelectric load are controlled so that a voltage across the piezoelectric load is an alternating current voltage.

In an embodiment, during one of two consecutive operation periods, a power supply voltage signal inputted to one end of the piezoelectric load changes with the reference voltage in one of two consecutive periods; and during the other of the two consecutive operation periods, a power supply voltage signal inputted to the other end of the piezoelectric load changes with the reference voltage in the other of the two consecutive periods.

Although the above embodiments are described and explained separately, there are some common technologies between different embodiments. Those skilled in the art may replace and integrate these embodiments. For content not clearly described in an embodiment, one may refer to relevant content described in another embodiment.

The embodiments of the present disclosure are as described above. Not all details are described in the embodiments, and the present disclosure is not limited to the described embodiments. Apparently, numerous modifications and variations may be made based on the above descriptions. The embodiments are selected and described in the specification to explain the principle and practical applications of the present disclosure well, so that those skilled in the art can make good use of the present disclosure and make modifications based on the present disclosure. The present disclosure is limited only by the claims, full scope and equivalents thereof.

The invention claimed is:

1. A driving circuit for driving a piezoelectric load, wherein the driving circuit comprises:
   a charging circuit configured to receive an input voltage to charge the piezoelectric load; and
   a discharging circuit configured to discharge electricity from the piezoelectric load, wherein
   during a first operation interval of an operation period, operation states of the charging circuit and the discharging circuit are controlled, so that a power supply voltage signal provided to the piezoelectric load in the first operation interval corresponds to a reference voltage in a first interval; and
   during a second operation interval of the operation period, the operation states of the charging circuit and the discharging circuit are controlled, so that the power supply voltage signal in the second operation interval corresponds to the reference voltage in a second interval, wherein during the first operation interval, the discharging circuit is controlled to be cut off and the charging circuit is controlled to adjust the power supply voltage signal to change with the reference voltage in the first interval; and during the second operation interval, the charging circuit is controlled to be cut off and the discharging circuit is controlled to adjust the power supply voltage signal to change with the reference voltage in the second interval.

2. The driving circuit according to claim 1, wherein during the first operation interval, the discharging circuit is controlled to be cut off, and the charging circuit is controlled to operate in a PWM control mode to charge the piezoelectric load.

3. The driving circuit according to claim 1, wherein during the second operation interval, the charging circuit is controlled to be cut off, and the discharging circuit is controlled to operate in a PWM control mode, wherein the piezoelectric load discharges electricity through the discharging circuit.

4. The driving circuit according to claim 1, wherein a waveform of the reference voltage is a sine wave with a trough value not less than zero.

5. The driving circuit according to claim 1, wherein the reference voltage in the first interval corresponds to a rising part of the reference voltage within a period, and the reference voltage in the second interval corresponds to a falling part of the reference voltage within the period.

6. The driving circuit according to claim 1, wherein the discharging circuit is connected to an output end of the charging circuit; or
   the discharging circuit is connected in parallel with the piezoelectric load; or
   the discharging circuit is connected in series with a first switch to form a branch, and the branch is connected to the output end of the charging circuit.

7. The driving circuit according to claim 1, further comprising:
   N voltage output circuits to drive N piezoelectric loads in one to one correspondence, wherein
   the N voltage output circuits are connected in parallel with each other;

for each of the N voltage output circuits:
the voltage output circuit comprises a selection switch;
the selection switch is connected in series with the piezoelectric load driven by the voltage output circuit; and
the voltage output circuit is switched on or off by controlling the operation states of the selection switch, and N is greater than or equal to 1.

8. The driving circuit according to claim 7, wherein all the N voltage output circuits share the discharging circuit, and the discharging circuit is connected in parallel with each of the N voltage output circuits.

9. The driving circuit according to claim 8, wherein each of the N voltage output circuits is connected to an output end of the charging circuit.

10. The driving circuit according to claim 8, further comprising a first switch, wherein
each of the N voltage output circuits is connected in series with the first switch to form a branch, and the branch is connected to an output end of the charging circuit.

11. The driving circuit according to claim 7, wherein the number of the discharging circuit is N, and the N voltage output circuits are coupled to the N discharging circuits in one to one correspondence, and for each of the N voltage output circuits, a discharging circuit coupled to the voltage output circuit is connected in parallel with a piezoelectric load driven by the voltage output circuit.

12. The driving circuit according to claim 1, wherein the number of the charging circuit is N, the number of the discharging circuit is N, and the N charging circuits are in one-to-one correspondence with the N discharging circuits, to provide power supply voltage signals for (N−1) piezoelectric loads, wherein
for each of the (N−1) piezoelectric loads:
two ends of the piezoelectric load are respectively connected to high potential ends of two of the N discharging circuits; and
power supply voltage signals provided for the two ends of the piezoelectric load are controlled, so that a voltage across the piezoelectric load is an alternating voltage, and
N is greater than or equal to 2.

13. The driving circuit according to claim 12, wherein
during one of two consecutive operation periods, the power supply voltage signal inputted to one end of the piezoelectric load changes with the reference voltage in one of two consecutive periods; and
during the other of the two consecutive operation periods, the power supply voltage signal inputted to the other end of the piezoelectric load changes with the reference voltage in the other of the two consecutive periods.

14. The driving circuit according to claim 12, wherein
first ends of the (N−1) piezoelectric loads are connected to a same discharging circuit among the N discharging circuits, and second ends of the (N−1) piezoelectric loads are connected to other (N−1) discharging circuits among the N discharging circuits in one to one correspondence.

15. The driving circuit according to claim 1, further comprising a control circuit, wherein
the control circuit is configured to generate a first control signal based on a compensation signal to control the operation state of the charging circuit, and to generate a second control signal based on the compensation signal to control the operation state of the discharging circuit, wherein
the compensation signal indicates a difference between the reference voltage and a sampling signal characterizing the power supply voltage signal.

16. The driving circuit according to claim 15, wherein the control circuit comprises:
a first PWM control circuit configured to generate the first control signal; and
a second PWM control circuit configured to generate the second control signal, wherein
during the first operation interval, the first PWM control circuit generates the first control signal of a PWM form based on the compensation signal, and the second PWM control circuit controls the second control signal to be invalid; and
during the second operation interval, the first PWM control circuit controls the first control signal to be invalid, and the second PWM control circuit generates the second control signal of a PWM form based on the compensation signal.

17. The driving circuit according to claim 1, wherein the discharging circuit comprises a charge pump, a discharging switch, or a branch formed by a plurality of discharging switches that are connected in parallel, to control the piezoelectric load to discharge electricity through the discharging circuit.

18. The driving circuit according to claim 1, wherein the charging circuit is a buck circuit, a boost circuit, a flyback circuit, a forward circuit, a boost-buck circuit or a buck-boost circuit.

19. A driving method, applied to a driving circuit, wherein the driving circuit comprises:
a charging circuit for receiving an input voltage to charge a piezoelectric load; and
a discharging circuit configured to discharge electricity from the piezoelectric load and
the driving method comprises:
during a first operation interval of an operation period, controlling operation states of the charging circuit and the discharging circuit, so that a power supply voltage signal provided to the piezoelectric load in the first operation interval corresponds to a reference voltage in a first interval; and
during a second operation interval of the operation period, controlling the operation states of the charging circuit and the discharging circuit, so that the power supply voltage signal in the second operation interval corresponds to the reference voltage in a second interval, wherein the reference voltage in the first interval corresponds to a rising part of the reference voltage within a period, and the reference voltage in the second interval corresponds to a falling part of the reference voltage within the period.

* * * * *